(12) United States Patent
Suh et al.

(10) Patent No.: US 10,340,358 B2
(45) Date of Patent: Jul. 2, 2019

(54) SEMICONDUCTOR DEVICE AND METHOD FOR FABRICATING THE SAME

(71) Applicant: SAMSUNG ELECTRONICS CO., LTD., Suwon-si, Gyeonggi-Do (KR)

(72) Inventors: Sung In Suh, Seoul (KR); Hoon Joo Na, Hwaseong-si (KR); Min Woo Song, Seongnam-si (KR); Byoung Hoon Lee, Suwon-si (KR); Chan Hyeong Lee, Seoul (KR); Hu Yong Lee, Seoul (KR); Sang Jin Hyun, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/951,639

(22) Filed: Apr. 12, 2018

(65) Prior Publication Data

US 2019/0081152 A1 Mar. 14, 2019

(30) Foreign Application Priority Data

Sep. 8, 2017 (KR) ........................ 10-2017-0115041

(51) Int. Cl.
*H01L 21/02* (2006.01)
*H01L 21/28* (2006.01)
(Continued)

(52) U.S. Cl.
CPC .... *H01L 29/4966* (2013.01); *H01L 21/02164* (2013.01); *H01L 21/28088* (2013.01);
(Continued)

(58) Field of Classification Search
CPC .............. H01L 29/4966; H01L 29/517; H01L 29/66545; H01L 21/02164; H01L 21/28088; H01L 21/28167
See application file for complete search history.

(56) References Cited

U.S. PATENT DOCUMENTS 9,123,644 B2  9/2015  Ogawa
9,136,180 B2  9/2015  Machkaoutsan et al.
(Continued)

FOREIGN PATENT DOCUMENTS

JP  2010123660   6/2010
KR  1020170028654  3/2017

OTHER PUBLICATIONS

Singapore Search Report dated Jul. 9, 2018 in corresponding Singapore Application No. 10201805096Y (3 pages).
(Continued)

*Primary Examiner* — Mark W Tornow
(74) *Attorney, Agent, or Firm* — F. Chau & Associates, LLC

(57) ABSTRACT

A semiconductor device and method for fabricating the same are provided. The semiconductor device includes a substrate, a first active pattern disposed on the substrate and spaced apart from the substrate, a gate insulating film which surrounds the first active pattern, a first work function adjustment film which surrounds the gate insulating film and includes carbon, and a first barrier film which surrounds the first work function adjustment film, in which a carbon concentration of the first work function adjustment film increases as it goes away from the first barrier film.

20 Claims, 31 Drawing Sheets

(51) Int. Cl.
*H01L 29/49* (2006.01)
*H01L 29/51* (2006.01)
*H01L 29/66* (2006.01)
*H01L 21/285* (2006.01)

(52) U.S. Cl.
CPC .. *H01L 21/28167* (2013.01); *H01L 21/28518* (2013.01); *H01L 29/517* (2013.01); *H01L 29/66545* (2013.01)

(56) References Cited

U.S. PATENT DOCUMENTS

| | | | |
|---|---|---|---|
| 9,337,057 | B2 | 5/2016 | Park et al. |
| 9,825,183 | B2 * | 11/2017 | Lee .................. H01L 29/66545 |
| 2005/0095763 | A1 | 5/2005 | Samavedam et al. |
| 2007/0057335 | A1 | 3/2007 | Tsuchiya et al. |
| 2013/0299918 | A1 * | 11/2013 | Kim ....................... H01L 29/78 257/402 |
| 2014/0166981 | A1 | 6/2014 | Doyle et al. |
| 2015/0097250 | A1 | 4/2015 | Cheon et al. |
| 2016/0204195 | A1 * | 7/2016 | Wen ................. H01L 21/02532 257/347 |
| 2017/0005191 | A1 * | 1/2017 | Wu ....................... H01L 29/785 |
| 2017/0084711 | A1 | 3/2017 | Lim et al. |
| 2017/0110324 | A1 | 4/2017 | Tsai et al. |
| 2017/0110552 | A1 | 4/2017 | Lee et al. |
| 2017/0148792 | A1 * | 5/2017 | Kim ....................... H01L 27/092 |
| 2017/0148891 | A1 | 5/2017 | Lai et al. |

OTHER PUBLICATIONS

Singapore Written Opinion dated Jul. 9, 2018 in corresponding Singapore Application No. 10201805096Y (6 pages).

\* cited by examiner

US 10,340,358 B2

SEMICONDUCTOR DEVICE AND METHOD FOR FABRICATING THE SAME

CROSS-REFERENCE TO RELATED APPLICATION

This application claims priority under 35 U.S.C. § 119 to Korean Patent Application No. 10-2017-0115041 filed on Sep. 8, 2017 in the Korean Intellectual Property Office, the disclosure of which is incorporated by reference herein in its entirety.

TECHNICAL FIELD

The present inventive concept relates to a semiconductor device and a method for fabricating the same, and more specifically, to a semiconductor device including a work function adjustment film and a method for fabricating the same.

DISCUSSION OF RELATED ART

Recently, with rapid spread of information media, semiconductor devices have developed dramatically with remarkable advances in their functionalities. In the case of new semiconductor products, low production cost is required to secure competitiveness, and high integration is required for high quality. To achieve higher integration of the semiconductor products, the semiconductor industry has relied on the continued scaling-down of the minimum feature sizes of the semiconductor devices.

SUMMARY

Aspects of the present inventive concept provide a semiconductor device and a method for fabricating the semiconductor device, in which operating performance and product reliability of the semiconductor device are enhanced by reducing the gate resistance.

According to an aspect of the present inventive concept, there is provided a semiconductor device including a substrate, a first active pattern disposed on the substrate and spaced apart from the substrate, a gate insulating film which surrounds the first active pattern, a first work function adjustment film which surrounds the gate insulating film and includes carbon, and a first barrier film which surrounds the first work function adjustment film, in which a carbon concentration of the first work function adjustment film increases as it goes away from the first barrier film.

According to another aspect of the present inventive concept, there is provided a semiconductor device including a substrate, a first active pattern disposed on the substrate and spaced apart from the substrate, a gate insulating film which surrounds the first active pattern, and a work function adjustment film which surrounds the gate insulating film and includes carbon, in which the work function adjustment film includes a first central portion which is disposed below the first active pattern and overlaps the first active pattern, and a second central portion which is disposed on the first active pattern and overlaps the first active pattern, in which a carbon concentration of the first central portion is different from a carbon concentration of the second central portion.

According to another aspect of the present inventive concept, there is provided a semiconductor device including a gate insulating film on a substrate, an n-type work function adjustment film including carbon on the gate insulating film, and a first barrier film including TiN on the n-type work function adjustment film, in which a carbon concentration of the n-type work function adjustment film increases as it goes away from the first barrier film.

According to another aspect of the present inventive concept, there is provided a method for fabricating a semiconductor device, the method including providing a substrate with a first active pattern disposed on the substrate and spaced apart from the substrate, forming a gate insulating film to surround the first active pattern, forming a work function adjustment film including carbon on the gate insulating film, forming a first barrier film on the work function adjustment film, and performing a film treatment process on the first barrier film to adjust a carbon concentration gradient in the work function adjustment film.

BRIEF DESCRIPTION OF THE DRAWINGS

The above and other aspects and features of the present inventive concept will become more apparent by describing in detail exemplary embodiments thereof with reference to the accompanying drawings, in which.

Figure 1:
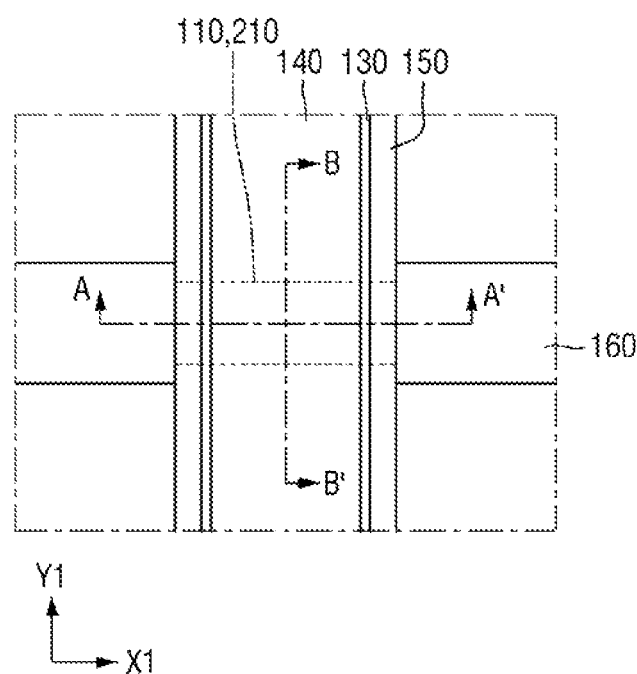
FIG. 1 is a schematic plan view for explaining the semiconductor device according to an exemplary embodiment of the present inventive concept.

Since the drawings in FIGS. 1-33 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Features of the present inventive concept and methods of accomplishing the same may be understood more readily by reference to the following detailed description of preferred exemplary embodiments in conjunction with the accompanying drawings. The present inventive concept may, however, be embodied in many different forms and should not be construed as being limited to the embodiments set forth herein. Rather, these embodiments are provided so that this disclosure will be thorough and complete and will fully convey the scope of the present inventive concept to those skilled in the art.

In the drawings of the semiconductor device according to exemplary embodiments of the present inventive concept, although a multi-bridge-channel field-effect transistor (MB-CFET) including a nanowire-shaped or a nanosheet-shaped channel region is illustrated as an example, the present inventive concept is not limited thereto. For example, the semiconductor device according to an exemplary embodiment of the present inventive concept may include a tunneling field-effect transistor (WET), a fin-type field-effect transistor (FinFET), a gate-all-around field-effect transistor (GAAFET) or a three-dimensional (3D) transistor. Further, for example, the semiconductor device according to an exemplary embodiment of the present inventive concept may include a bipolar junction transistor (BST), a lateral double diffused metal oxide semiconductor transistor (LD-MOS), or the like. In general, the MBCFET may have a larger current drivability, better subthreshold swing, and larger on-off state current ratio than a conventional planar metal-oxide-semiconductor field-effect transistor (MOSFET).

Figure 2:
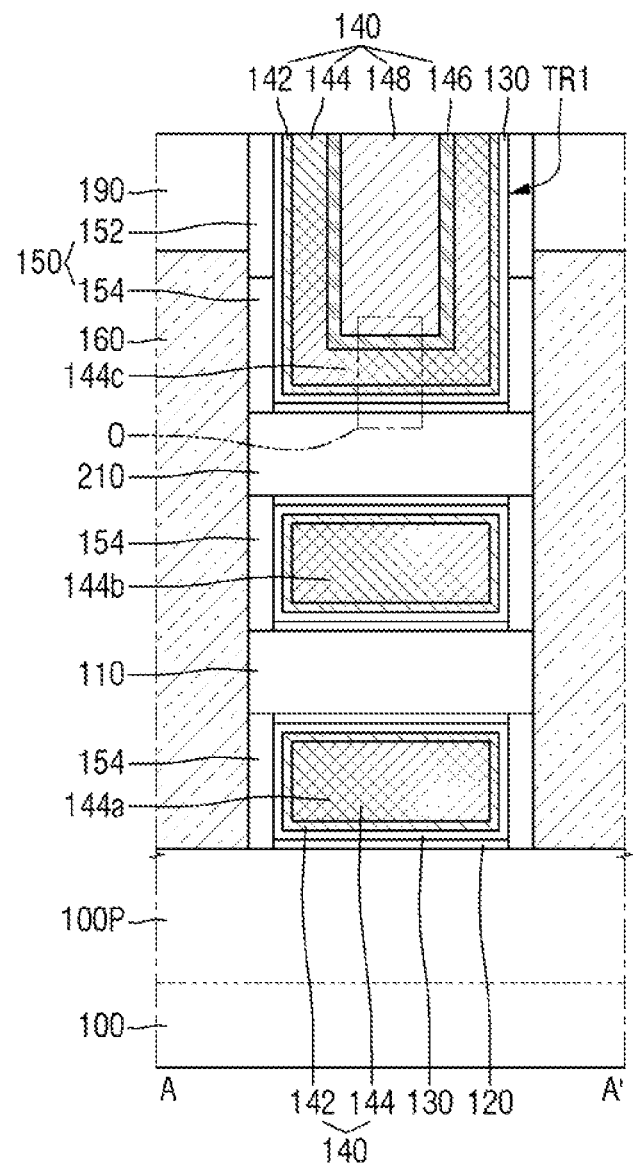
FIG. 2 is a cross-sectional view taken along line A-A' of FIG. 1.
Figure 3:
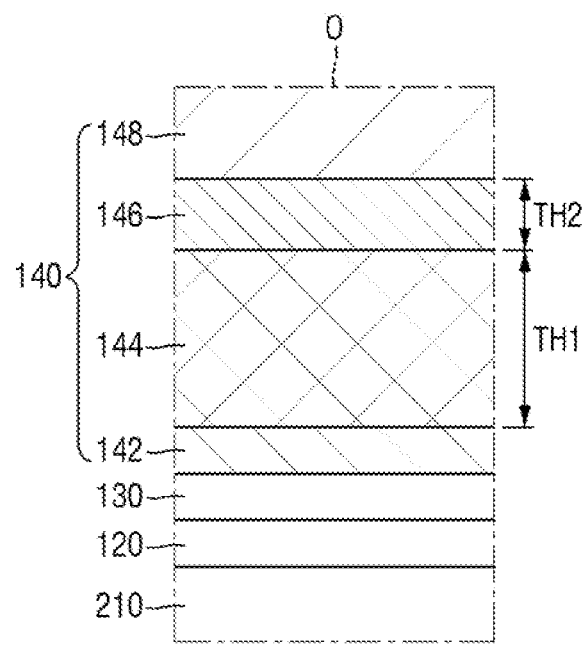
FIG. 3 is an enlarged view of a region O of FIG. 1.
Figure 4:
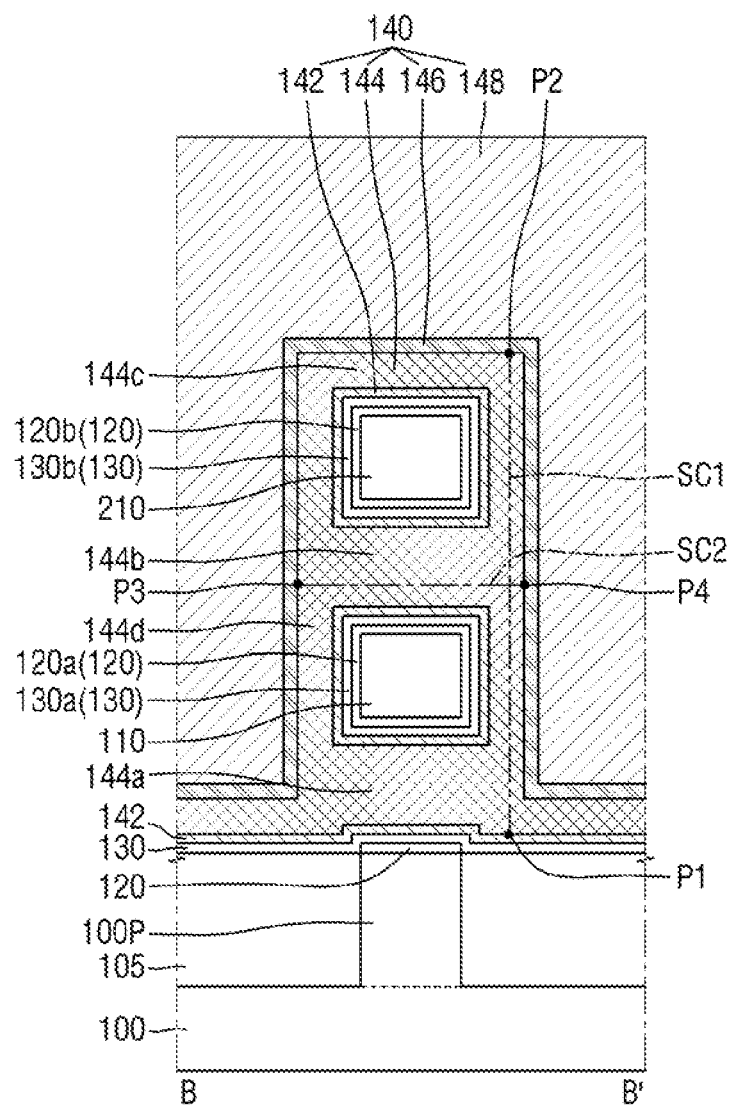
FIG. 4 is a cross-sectional view taken along line B-B' of FIG. 1.
Figure 5:
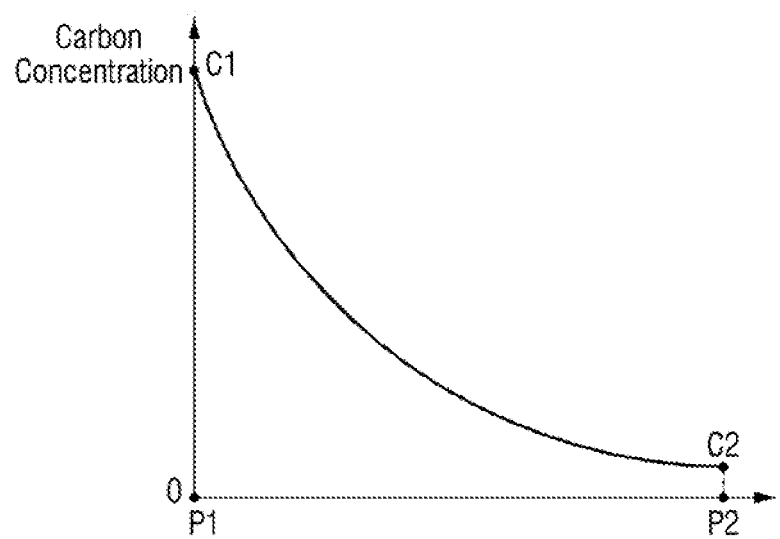
FIGS. 5 and 6 are graphs illustrating changes in carbon concentration in accordance with SC1 and SC2 of FIG. 4.
Figure 6:
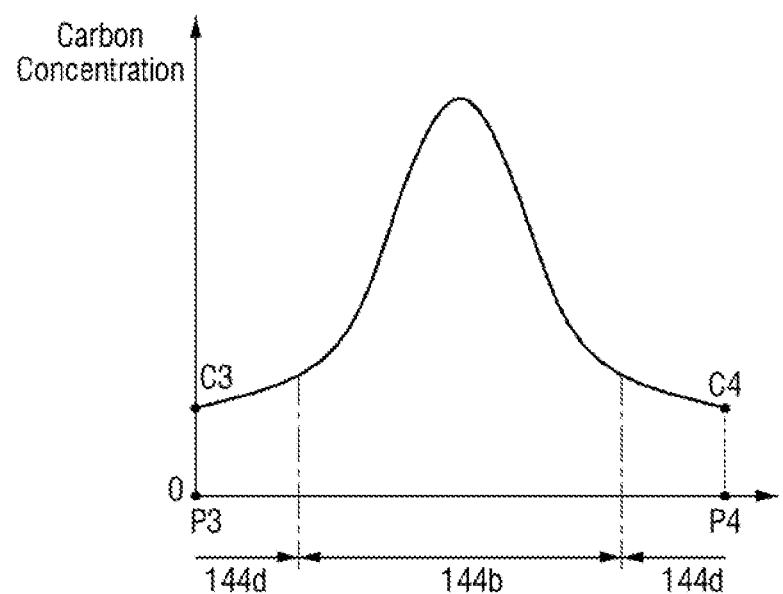

Hereinafter, a semiconductor device according to an exemplary embodiment of the present inventive concept will be described with reference to FIGS. 1 to 6. FIG. 1 is a schematic plan view for explaining the semiconductor device according to an exemplary embodiment of the present inventive concept. FIG. 2 is a cross-sectional view taken along line A-A' of FIG. 1. FIG. 3 is an enlarged view of a region O of FIG. 1. FIG. 4 is a cross-sectional view taken along line B-B' of FIG. 1. FIGS. 5 and 6 are graphs illustrating changes in carbon concentration in accordance with SC1 and SC2 of FIG. 4.

Referring to FIGS. 1 to 4, the semiconductor device according to an exemplary embodiment of the present inventive concept includes a substrate 100, a field insulating film 105, a first active pattern 110, a second active pattern 210, a first interfacial film 120, a first gate insulating film 130, a first gate electrode 140, a first gate spacer 150, a first source/drain region 160, and an interlayer insulating film 190.

The substrate 100 may be bulk silicon (Si) or silicon-on-insulator (SOI). Alternatively, the substrate 100 may be a silicon substrate or may include other substances. For example, the substrate 100 may include silicon germanium (SiGe), silicon germanium on insulator (SGOI), silicon carbide (SiC), indium antimonide (InSb), lead tellurium compound (PbTe), indium arsenide (InAs), indium phosphide (InP), gallium arsenide (GaAs), gallium nitride (GaN) or gallium antimonide (GaSb). Also, the substrate 100 may have an epitaxial layer formed on a base substrate, and the epitaxial layer may include one or more of the materials described above. For convenience of explanation, hereinafter, the substrate 100 will be described as a substrate including silicon.

The substrate 100 may include a first fin-type protrusion 100P. The first fin-type protrusion 100P may protrude from the upper surface of the substrate 100 and may extend along a first direction X1. The first fin-type protrusions 100P may be formed by etching a part of the substrate 100, or may be an epitaxial layer that is grown from the substrate 100.

The first fin-type protrusion MOP may include silicon or germanium which is an elemental semiconductor substance. Further, the first fin-type protrusion 100P may include a compound semiconductor. For example, the first fin-type protrusion 100P may include a group IV-IV compound semiconductor or a group III-V compound semiconductor.

The group IV-IV compound semiconductor may be, for example, a binary compound or a ternary compound including at least two or more of carbon (C), silicon (Si), germanium (Ge), and tin (Sn), or a compound obtained by doping these elements with the group IV elements.

The group III-V compound semiconductor may be, for example, one of a binary compound, a ternary compound or a quaternary compound formed by bonding at least one of aluminum (Al), gallium (Ga), and indium (In) which are the group III elements, with at least one of nitrogen (N), phosphorus (P), arsenic (As), and antimony (Sb) which are the group V elements.

A field insulating film 105 may be formed on the substrate 100, and may wrap at least a part of the sidewalls of the first fin-type protrusion 100P. Accordingly, the first fin-type protrusion 100P may be defined by the field insulating film 105.

In FIG. 4, the sidewalls of the first active pattern 110 and the second active pattern 210 are illustrated as being entirely surrounded by the field insulating film 105, but this is only for the convenience of explanation, and the present inventive concept is not limited thereto.

The field insulating film 105 may include, for example, at least one of an oxide film, a nitride film, an oxynitride film, and any combination thereof.

The first active pattern 110 may be disposed on the substrate 100, and may be spaced apart from the substrate 100. Similar to the first fin-type protrusion 100P, the first active pattern 110 may extend along the first direction X1.

The first active pattern 110 may be formed on the first fin-type protrusion 100P and spaced apart from the first fin-type protrusion 100P, and may vertically overlap the first fin-type protrusion 100P. That is, the first active pattern 110 may be formed on the first fin-type protrusion 100P, rather than being formed on the field insulating film 105.

The second active pattern 210 may be disposed on the first active pattern 110 and spaced apart from the first active pattern 110. Similar to the first fin-type protrusion 100P and the first active pattern 110, the second active pattern 210 may extend along the first direction X1. The second active pattern 210 may vertically overlap the first active pattern 110.

The first active pattern 110 and the second active pattern 210 may include silicon or germanium which is the elemental semiconductor substance. Each of the first active pattern 110 and the second active pattern 210 may include a compound semiconductor, and may include, for example, a group IV-IV compound semiconductor or a group III-V compound semiconductor.

The first active pattern 110 and the second active pattern 210 may include a substance the same as that of the first fin-type protrusion 100P, or may include a substance different from that of the first fin-type protrusion 100P.

The first active pattern 110 and the second active pattern 210 may each be used as a channel region of a transistor, respectively. For example, the first active pattern 110 and the second active pattern 210 may each be used as the channel region of the N-channel MOSFET (NMOS) transistor.

In the drawings of the semiconductor device according to exemplary embodiments of the present inventive concept, a semiconductor device including only two active patterns is exemplarily illustrated, but the present inventive concept is not limited thereto. For example, the semiconductor device according to an exemplary embodiment of the present inventive concept may include one active pattern or three or more active patterns. Since one or more active patterns may be formed as the channels for a transistor such as, for example, MBCFET, the MBCFET may include a plurality of rectangular or circular (e.g., a nanosheet-shaped or a nanowire-shaped) thin channels vertically stacked. As illustrated in FIG. 4, two rectangular active patterns (the first and second active patterns 110 and 210) are vertically stacked.

The first interfacial film 120 may be formed along the periphery of the first active pattern 110 and the periphery of the second active pattern 210. Accordingly, the first interfacial film 120 may surround the first active pattern 110 and the second active pattern 210. For example, as illustrated in FIG. 4, the first interfacial film 120 may include a first sub-interfacial film 120a surrounding the first active pattern 110, and a second sub-interfacial film 120b surrounding the second active pattern 210.

The first interfacial film 120 may be formed on the first fin-type protrusion 100P. Further, as illustrated in FIGS. 2 and 3, the first interfacial film 120 may be formed on the bottom surface of the first trench TR1. Although the first interfacial film 120 is illustrated as not being formed on the sidewall of the first trench TR1, the present inventive concept is not limited thereto. Depending on the method for forming the first interfacial film 120, the first interfacial film 120 may be formed on the sidewalls of the first trench TR1. Also, in an exemplary embodiment of the present inventive concept, the first interfacial film 120 may be omitted.

The first interfacial film 120 may include, for example, silicon oxide, but the present inventive concept is not limited thereto. Depending on the type of the substrate 100, the types of the first active pattern 110 and the second active pattern 210, and the type of the first gate insulating film 130, the first interfacial film 120 may include other substances.

The first gate insulating film 130 may be formed on the first interfacial film 120, and may be formed along the periphery of the first active pattern 110 and periphery of the second active pattern 210. Accordingly, the first gate insulating film 130 may surround the first interfacial film 120. For example, as illustrated in FIG. 4, the first gate insulating film 130 may include a first sub-gate insulating film 130a which surrounds the first sub-interfacial film 120a, and a second sub-gate insulating film 130b which surrounds the second sub-interfacial film 120b.

The first gate insulating film 130 may also be formed on the upper surface of the field insulating film 105 and on the first fin-type protrusion 100P, and may extend along the inner wall of the first gate spacer 150. That is, the first gate insulating film 130 may extend along the sidewalls and the bottom surface of the first trench TR1, the periphery of the first active pattern 110, and the periphery of the second active pattern 210.

The first gate insulating film 130 may include, for example, at least one of silicon oxide ($SiO_2$), silicon nitride (SiN), silicon oxynitride (SiON) and a high-dielectric constant substance having a dielectric constant larger than silicon oxide.

The first gate electrode 140 may extend on the substrate 100 along a second direction Y1 intersecting the first direction X1. As illustrated in FIGS. 1, 2 and 4, the first gate electrode 140 may intersect with the first fin-type protrusion 100P, the first active pattern 110, and the second active pattern 210.

The first gate electrode 140 may be formed to wrap the peripheries of the first active pattern 110 and the second active pattern 210. In addition, the first gate electrode 140 may also be formed in a separated space between the first fin-type protrusion 100P and the first active pattern 110, and a separated space between the first active pattern 110 and the second active pattern 210.

The first gate electrode 140 may be formed on the first gate insulating film 130, and may fill the first trench TR1.

The first gate electrode 140 may include a first lower conductive film 142, a first work function adjustment film 144, a first barrier film 146, and a first filling conductive film 148.

The first lower conductive film 142 may be formed on the first gate insulating film 130, and may be formed along the profile of the first gate insulating film 130. The first lower conductive film 142 may be formed along the peripheries of the first active pattern 110 and the second active pattern 210. Accordingly, the first lower conductive film 142 may surround the first gate insulating film 130.

The first lower conductive film 142 may also be formed on the upper surface of the field insulating film 105 and on the first fin-type protrusion 100P, and may extend along the inner sidewalls of the first gate spacer 150. That is, the first lower conductive film 142 may extend along the sidewalls and the bottom surface of the first trench TR1, the periphery of the first active pattern 110, and the periphery of the second active pattern 210.

The first lower conductive film 142 may include, for example, a metal nitride, and may include, for example, at least one of titanium nitride (TiN), tantalum nitride (TaN), tungsten nitride (WN), and any combination thereof. Further, the first lower conductive film 142 may be formed with an appropriate thickness, depending on the type of the semiconductor device to be formed.

In the following description, the first lower conductive film 142 will be described as including TiN.

In the fabricating process of the semiconductor device according to an exemplary embodiment of the present inventive concept, the first lower conductive film 142 may be used for curing oxygen atom defects in the first gate insulating film 130. For example, the first lower conductive film 142 may cure oxygen atom defects in the first gate insulating film 130 through a heat treatment.

The first work function adjustment film 144 may be formed on the first lower conductive film 142, and may be formed along the profile of the first lower conductive film 142. Further, the first work function adjustment film 144 may be formed along the peripheries of the first active pattern 110 and the second active pattern 210. Thus, the first work function adjustment film 144 may surround the first lower conductive film 142.

The first work function adjustment film 144 may also be formed on the upper surface of the field insulating film 105 and on the first fin-type protrusion 100P, and may extend along the inner wall of the first gate spacer 150. That is, the first work function adjustment film 144 may extend along the sidewalls and the bottom surface of the first trench TR1, the periphery of the first active pattern 110, and the periphery of the second active pattern 210.

As the scaling-down of the semiconductor device progresses, the interval between the active patterns may be narrowed. As a result, the first work function adjustment film 144 may be formed at a certain thickness or less. For example, referring to FIG. 3, a first thickness TH1 of the first work function adjustment film 144 may be about 30 Å or less.

In an exemplary embodiment of the present inventive concept, the first work function adjustment film 144 may also be formed in a separated space between the first tin-type protrusion 100P and the first active pattern 110, and in a separated space between the first active pattern 110 and the second active pattern 210. For example, as illustrated in FIG. 4, the first work function adjustment film 144 may include a first central portion 144a, a second central portion 144b, a third central portion 144c, and a side portion 144d.

The first central portion 144a of the first work function adjustment film 144 may be a part of the first work function adjustment film 144 disposed below the first active pattern 110. For example, the first central portion 144a may be disposed between the first fin-type protrusion 100P and the first active pattern 110.

The first central portion 144a may overlap the first active pattern 110. That is, the first central portion 144a may be disposed below the first active pattern 110, and may vertically overlap the first active pattern 110 above. For example, the first central portion 144a may be in contact with the bottom surface of the first lower conductive film 142 which surrounds the first active pattern 110.

The second central portion 144b of the first work function adjustment film 144 may be a part of the first work function adjustment film 144 disposed between the first active pattern 110 and the second active pattern 210.

The second central portion 144b may overlap the first active pattern 110 and the second active pattern 210. That is, the second central portion 144b may be disposed between the first active pattern 110 and the second active pattern 210, and may vertically overlap the first active pattern 110 below and the second active pattern 210 above. For example, the second central portion 144b may be in contact with the upper surface of the first lower conductive film 142 surrounding the first active pattern 110, and the bottom surface of the first lower conductive film 142 surrounding the second active pattern 210.

The third central portion 144c of the first work function adjustment film 144 may be a part of the first work function adjustment film 144 disposed on the second active pattern 210.

The third central portion 144c may overlap the second active pattern 210. That is, the third central portion 144c may be disposed over the second active pattern 210, and may vertically overlap the second active pattern 210 below. For example, the third central portion 144c may be in contact with the upper surface of the first lower conductive film 142 surrounding the second active pattern 210.

The side portion 144d of the first work function adjustment film 144 may be a part of the first work function adjustment film 144 which extends on both sidewalls of the first active pattern 110 and both sidewalk of the second active pattern 210. Further, the side portion 144d may be connected to the first central portion 144a, the second central portion 144b, and the third central portion 144c. For example, the side portion 144d may extend along the sidewalls of the first central portion 144a, the sidewalls of the first active pattern 110, the sidewalls of the second central portion 144b, the sidewalk of the second active pattern 210, and the sidewalk of the third central portion 144c. The sidewalls between the side portion 144d and the first central portion 144a, the second central portion 144b, the third central portion 144c are used here to define these portions, and may not physically exist.

The first work function adjustment film 144 may include carbon (C). Further, the first work function adjustment film 144 including carbon may further include, for example, at least one of titanium (Ti), tantalum (Ta), tungsten (W), ruthenium (Ru), niobium (Nb), molybdenum (Mo), hafnium (Hf), lanthanum (La), aluminum (Al), and any combination thereof.

The first work function adjustment film 144 may have a carbon concentration gradient. For example, the carbon concentrations of the first central portion 144a, the second central portion 144b, and the third central portion 144c may be different from each other. Also, for example, the carbon concentration of the side portion 144d may gradually decrease as it goes away from the upper surface of the substrate 100. This will be described later in detail with reference to FIGS. 5 and 6. That is, the closer the portion of the film in the side portion 144d to the upper surface of the substrate 100, the higher the carbon concentration in that portion of the film, as will be illustrated later in FIGS. 5 and 6.

In an exemplary embodiment of the present inventive concept, the first work function adjustment film 144 may be an n-type work function adjustment film. For example, the first work function adjustment film 144 may include titanium-aluminum carbide MAW) or titanium-aluminum carbonitride (TiAlCN). Further, for example, the first work function adjustment film 144 may include a substance obtained by replacing Ti with one of Ta, W, Ru, Nb, Mo, Hf and La from the above-mentioned substances.

In the following description, the first work function adjustment film 144 will be described as including TiAlC.

The first barrier film 146 may be formed on the first work function adjustment film 144, and may be formed along the profile of the first work function adjustment film 144.

The first barrier film 146 may also be formed on the upper surface of the field insulating film 105 and on the first fin-type protrusion 100P, and may extend along the inner sidewalls of the first gate spacer 150. That is, the first barrier film 146 may extend along the sidewalls and the bottom surface of the first trench TR1.

The first barrier film 146 may be used in a film treatment process (FT of FIGS. 32 and 33) for adjusting the carbon concentration gradient of the first work function adjustment film 144, and may include, for example, TiN. This will be described later in detail with reference to FIGS. 32 and 33.

The first barrier film 146 may be formed at a constant thickness or less so as to be used in performing the film treatment process FT of the first work function adjustment film 144. For example, referring to FIG. 3, a second thickness TH2 of the first barrier film 146 may be about 20 Å or less.

An oxide film may be interposed between the first barrier film 146 and the first work function adjustment film 144. The oxide film may be a film formed by natural oxidation of the surface of the first work function adjustment film 144. For example, in the fabricating process of the semiconductor device according to an exemplary embodiment of the present inventive concept, the surface of the first work function adjustment film 144 may be oxidized to form an oxide film.

In the semiconductor device according to an exemplary embodiment of the present inventive concept, the thickness of the oxide film may be minimized by the film treatment process FT. For example, the thickness of the oxide film may be about 5 Å or less.

In an exemplary embodiment of the present inventive concept, the first barrier film 146 may be in direct contact with the first work function adjustment film 144. That is, another film may not be interposed between the first barrier film 146 and the first work function adjustment film 144.

Figure 32:
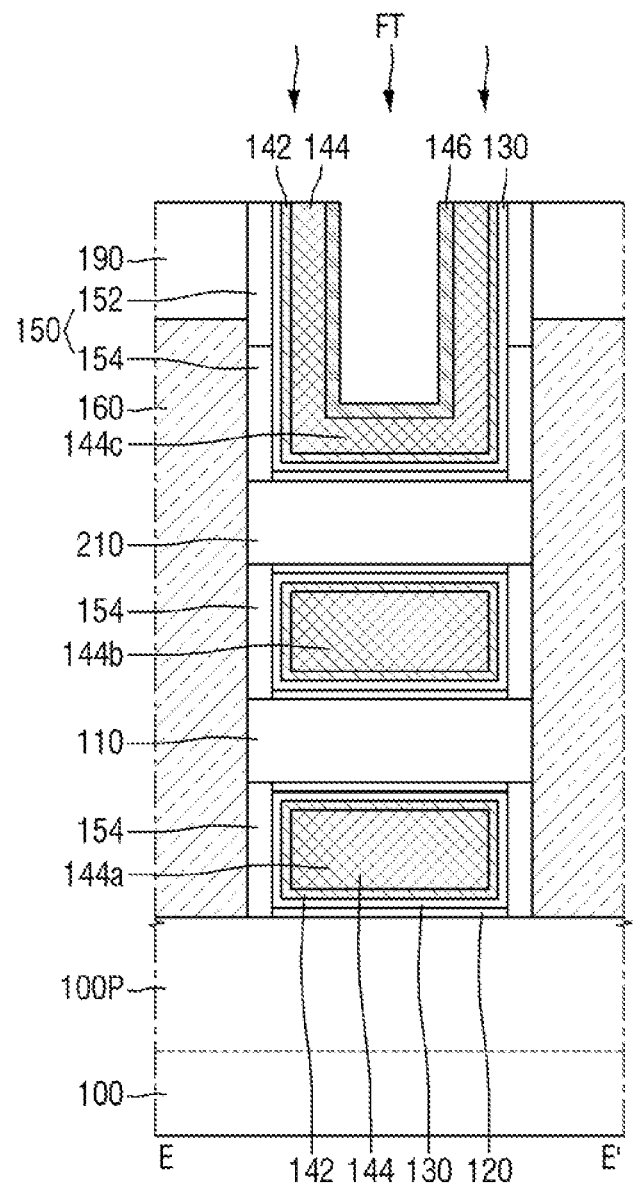
Figure 33:
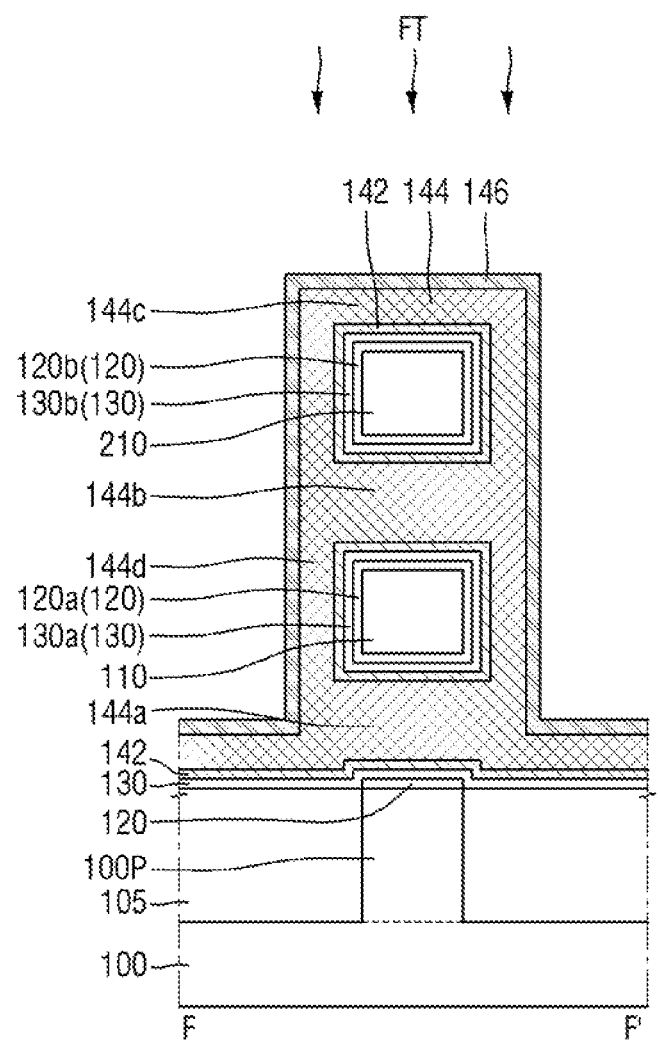

The first barrier film 146 may have a thickness capable of preventing re-oxidation of the first work function adjustment film 144 after the film treatment process (FT of FIGS. 32 and 33). For example, the second thickness TH2 of the first barrier film 146 may be about 10 Å or more, That is, the second thickness TH2 of the first barrier film 146 may be in a range from about 10 Å to about 20 Å.

The first filling conductive film 148 may be formed on the first barrier film 146. Further, the first filling conductive film 148 may fill the remaining space of the first trench TR1 which is left after formation of the first interfacial film 120, the first gate insulating film 130, the first lower conductive film 142, the first work function adjustment film 144, and the first barrier film 146.

The first filling conductive film 148 may include, for example, at least one of tungsten (W), aluminum (Al), cobalt (Co), copper (Cu), ruthenium (Ru), nickel (Ni), platinum (Pt), nickel-platinum (Ni—Pt), and any combination thereof.

The first gate spacer 150 may be formed on both sidewalls of the first gate electrode 140 extending in the second direction Y1. For example, as illustrated in FIG. 2, the first gate spacer 150 may be formed to face each other on both sides of the first gate electrode 140. Further, the first gate spacer 150 may define a first trench TR1 which intersects with the first active pattern 110 and the second active pattern 210.

The first gate spacer 150 may include a first outer spacer 152 and a first inner spacer 154. The first inner spacer 154 may be disposed between the first fin-type protrusion 100P and the first active pattern 110, and between the first active pattern 110 and the second active pattern 210.

The first outer spacer 152 may be disposed on the first inner spacer 154. In FIG. 2, although the first inner spacer 154 and the first outer spacer 152 are illustrated as being sequentially located on the second active pattern 210, this is only for convenience of explanation, and the present inventive concept is not limited thereto. For example, only the first outer spacer 152 may be disposed on the second active pattern 210 in accordance with the structure of the stacked body for forming the first active pattern 110 and the second active pattern 210.

The first source/drain region 160 may be formed to be adjacent to the first gate electrode 140. For example, as illustrated in FIG. 2, the first source/drain region 160 may be formed on both sidewalls of the first gate electrode 140.

The first source/drain region 160 may include an epitaxial layer formed on the first fin-type protrusion 100P. Also, the first source/drain region 160 may be a raised source/drain region including an upper surface protruding upward from the upper surface of the substrate 100. However, the present inventive concept is not limited thereto. For example, the first source/drain region 160 may be an impurity region formed in the substrate 100.

The interlayer insulating film 190 may be formed on the substrate 100, and may surround the outer wall of the first gate spacer 150 which defines the first trench TR1.

The interlayer insulating film 190 may include, for example, at least one of silicon oxide ($SiO_2$), silicon nitride (SiN), silicon oxynitride (SiON), and a low-dielectric constant substance.

FIGS. 5 and 6 are graphs illustrating changes in carbon concentration of the first work function adjustment film 144 in accordance with SC1 and SC2 of FIG. 4.

The semiconductor device according to an exemplary embodiment of the present inventive concept may include a first work function adjustment film 144 having a carbon concentration gradient. For example, in the semiconductor device according to an exemplary embodiment of the present inventive concept, the first work function adjustment film 144 may include a first central portion 144a, a second central portion 144b, a third central portion 144c, and a side portion 144d having different carbon concentrations from each other.

Referring to FIGS. 5 and 6, in the semiconductor device according to an exemplary embodiment of the present inventive concept, the carbon concentration of the first work function adjustment film 144 may increase as it goes away from the first barrier film 146. In other words, the carbon concentration of the first work function adjustment film 144 varies and depends on the location of the first work function adjustment film 144 within the first work function adjustment film 144, and as the location moves away from the first harrier film 146, the carbon concentration becomes higher. That is, the carbon concentration of the portion of the first work function adjustment film 144 near the first barrier film 146 is lower than the carbon concentration of the portion of the first work function adjustment film 144 far away from the first barrier film 146.

FIG. 5 is an exemplary graph illustrating a change in carbon concentration of the first work function adjustment film 144 when moving along the first scan line SC1 of FIG. 4. The first scan line SC1 is a straight line which connects a first point (P1 of FIG. 4) of the first work function adjustment film 144 and a second point (P2 of FIG. 4) of the first work function adjustment film 144. The first scan line SC1 may be perpendicular to the upper surface of the substrate 100.

The first point P1 of the first work function adjustment film 144 is one point on the bottom surface of the first work function adjustment film 144. For example, the first point P1 may be one point on the bottom surface of the side portion 144d of the first work function adjustment film 144. A second point P2 of the first work function adjustment film 144 is a point at which a straight line starting at the first point P1 and perpendicular to the upper surface of the substrate 100 meets the upper surface of the first work function adjustment film 144. Since the first scan line SC1 is a straight line which connects the first point P1 and the second point P2, the first scan line SC1 may be perpendicular to the upper surface of the substrate 100.

Referring to FIG. 5, when moving from the first point P1 to the second point P2 along the first scan line SC1, the carbon concentration of the first work function adjustment film 144 may gradually decrease. For example, the carbon concentration of the first work function adjustment film 144 may gradually decrease from the first concentration C1 of the first point P1 to reach the second concentration C2 of the second point P2.

Based on FIGS. 4 and 5, the carbon concentration of the first work function adjustment film 144 may increase as it goes away from the first barrier film 146 formed on the third central portion 144c of the first work function adjustment film 144. That is, the carbon concentration of the first work function adjustment film 144 varies and depends on the location of the first work function adjustment film 144 within the first work function adjustment film 144, and as the location moves away from the first barrier film 146, the carbon concentration becomes higher.

As illustrated in FIG. 4, the upper surface of the first work function adjustment film 144 may be in contact with the first barrier film 146, and the bottom surface of the first work function adjustment film 144 may not be in contact with the first barrier film 146. For example, the bottom surface of the side portion 144d and the bottom surface of the first central portion 144a may not be in contact with the first barrier film 146. However, the upper surface of the third central portion 144c and the upper surface of the side portion 144d of the first work function adjustment film 144 may be in contact with the first barrier film 146. As a result, the carbon concentration of the first work function adjustment film 144 may gradually decrease as it goes away from the upper surface of the substrate 100. That is, the farther the portion of the film in the first work function adjustment film 144 away from the upper surface of the substrate 100, the lower the carbon concentration of the first work function adjustment film 144 in that portion of the film, and the decrease may be gradual.

In an exemplary embodiment of the present inventive concept, the carbon concentration of the side portion 144d of the first work function adjustment film 144 may gradually decrease as it goes away from the upper surface of the substrate 100. Further, for example, the carbon concentration of the first central portion 144a may be greater than the carbon concentration of the second central portion 144b, and the carbon concentration of the second central portion 144b may be greater than the carbon concentration of the third central portion 144c. This is due to that the first central portion 144a is closer to the substrate 100 than the second central portion 144b, and the second central portion 144b is closer to the substrate 100 than the third central portion 144c.

FIG. 6 is a graph illustrating a change in carbon concentration of the first work function adjustment film 144 when moving along the second scan line SC2 of FIG. 4. The second scan line SC2 is a straight line Which connects the third point (P3 of FIG. 4) of the first work function adjustment film 144 and the fourth point (P4 of FIG. 4) of the first work function adjustment film 144. The second scan line SC2 may be parallel to the upper surface of the substrate 100.

The third point P3 of the first work function adjustment film 144 is one point on one sidewall of the first work function adjustment film 144. A fourth point P4 of the first work function adjustment film 144 is a point at which a straight line starting at the third point P3 and parallel to the upper surface of the substrate 100 meets the other sidewall of the first work function adjustment film 144. Since the second scan line SC2 is a straight line which connects the third point P3 and the fourth point P4, the second scan line SC2 may be parallel to the upper surface of the substrate 100.

Referring to FIG. 6, when moving from the third point P3 to the fourth point P4 along the second scan line SC2, the carbon concentration of the first work function adjustment film 144 may increase and then decrease. For example, the carbon concentration of the first work function adjustment film 144 may increase and then decrease from the third concentration C3 of the third point P3 to reach the fourth concentration C4 of the fourth point P4. In an exemplary embodiment of the present inventive concept, the third concentration C3 and the fourth concentration C4 may be the same.

Based on FIGS. 4 and 6, the carbon concentration of the first work function adjustment film 144 may increase as it goes away from the first barrier film 146 formed on both sidewalls of the first work function adjustment film 144. That is, the carbon concentration of the first work function adjustment film 144 varies and depends on the location of the first work function adjustment film 144 within the first work function adjustment film 144, and as the location moves away from the first barrier film 146 on both sidewalls of the first work function adjustment film 144, the carbon concentration becomes higher.

As illustrated in FIG. 4, both sidewalls of the first work function adjustment film 144 may be in contact with the first barrier film 146. For example, both side portions 144d of the first work function adjustment film 144 may be in contact the first barrier film 146. Thus, when moving along a plane parallel to the upper surface of the substrate 100 from one sidewall to the other opposite sidewall of the first work function adjustment film 144, the carbon concentration of the first work function adjustment film 144 may increase and then decrease.

In an exemplary embodiment of the present inventive concept, the carbon concentration of the second central portion 144b may be higher than the carbon concentration of the side portion 144d located at that same level. Further, for example, when moving along a plane parallel to the upper surface of the substrate 100 from one sidewall to the other opposite sidewall of the second central portion 144b, the carbon concentration of the second central portion 144b may increase and then decrease. The carbon concentration of the first work function adjustment film 144 may start with one relatively low concentration (e.g. the third concentration C3) at one sidewall of the first work function adjustment film 144 (e.g., the sidewall of the sidle portion 144d at the third point P3) and may gradually increase along the plane (or the second scan line SC2) parallel to the upper surface of the substrate 100 to reach a highest concentration at about the middle of the second central portion 144b, then may gradually decrease to reach another relatively low concentration (e.g. the fourth concentration C4) at the other opposite sidewall of the first work function adjustment film 144 (e.g., the sidewall of the side portion 144d at the fourth point P4).

The carbon concentration gradient of the aforementioned first work function adjustment film 144 may be attributed to, for example, the film treatment process (FT of FIGS. 32 and 33). The film treatment process FT will be described later in detail with reference to FIGS. 32 and 33.

In an exemplary embodiment of the present inventive concept, the third concentration C3 and the fourth concentration C4 may be greater than the second concentration C2 of FIG. 1. This may be attributed to, for example, the directionality of the film treatment process FT. For example, the upper surface of the first work function adjustment film 144 and the side surface of the first work function adjustment film 144 may be affected differently by the directionality of the film treatment process FT. For example, when the film treatment process FT is performed in a direction from above to below, the upper surface of the first work function adjustment film 144 may be affected to be greater than the side surface of the first work function adjustment film 144.

As the scaling-down of the semiconductor device progresses, the interval between the active patterns may be narrowed. However, as the interval between the active patterns is narrowed, there is a problem of a decrease in the thickness of the gate electrode and an increase in the gate resistance. Although the thickness of the work function adjustment film may be reduced to reduce the gate resistance, in such a case, adjustment of the threshold voltage may be difficult. For example, when reducing the thickness of the n-type work function adjustment film, the effective work function (eWF) increases, making it difficult to adjust the threshold voltage.

In the semiconductor device according to an exemplary embodiment of the present inventive concept, it is possible to provide the first work function adjustment film 144 in which the surface oxide film is minimized and the carbon concentration is reduced, using the film treatment process (FT of FIGS. 32 and 33). Therefore, the gate resistance can be reduced, and as a result, the operation performance and the product reliability of the semiconductor device can be enhanced.

It is preferred that the effective work function of the first work function adjustment film 144 can be adjusted (tuned, modulated or controlled). For example, changing the carbon concentration in the first work function adjustment film 144 may change the effective work function value. Thus, it is possible to adjust the effective work function of the first work function adjustment film 144 to different values by controlling the carbon concentration depending on the intended use.

When the effective work function of the first work function adjustment film 144 surrounding the first active pattern 110 and/or the second active pattern 210 increases, the threshold voltage of the first active pattern 110 and/or the second active pattern 210 may increase correspondingly. Engineering threshold voltage through variation of gate work function of a transistor can produce transistors that may reduce short channel effects and higher device performance. Thus, in an exemplary embodiment of the present inventive concept, the short channel effect in a transistor, for example, MBCFET may be controlled by proper adjustment of the effective work function (e.g., proper control of the carbon concentration) of the first work function adjustment film 144 surrounding the first active pattern 110 and/or the second active pattern 210.

In the semiconductor device according to an exemplary embodiment of the present inventive concept, the semiconductor device having multi-threshold voltage can be achieved. For example, as described above with reference to FIG. 4, the carbon concentration of the first central portion 144a may be greater than the carbon concentration of the second central portion 144b, and the carbon concentration of the second central portion 144b may be greater than the carbon concentration of the third central portion 144c. Since the effective work function of the first work function adjustment film 144 may differ depending on the carbon concentration, the effective work function of the first work function adjustment film 144 surrounding the first active pattern 110 may be different from the effective work function of the first work function adjustment film 144 surrounding the second active pattern 210. That is, the threshold voltage of the first active pattern 110 and the threshold voltage of the second active pattern 210 may be different from each other. Accordingly, according to an exemplary embodiment of the present inventive concept, the semiconductor device having multi-threshold voltage may be achieved.

Figure 7:
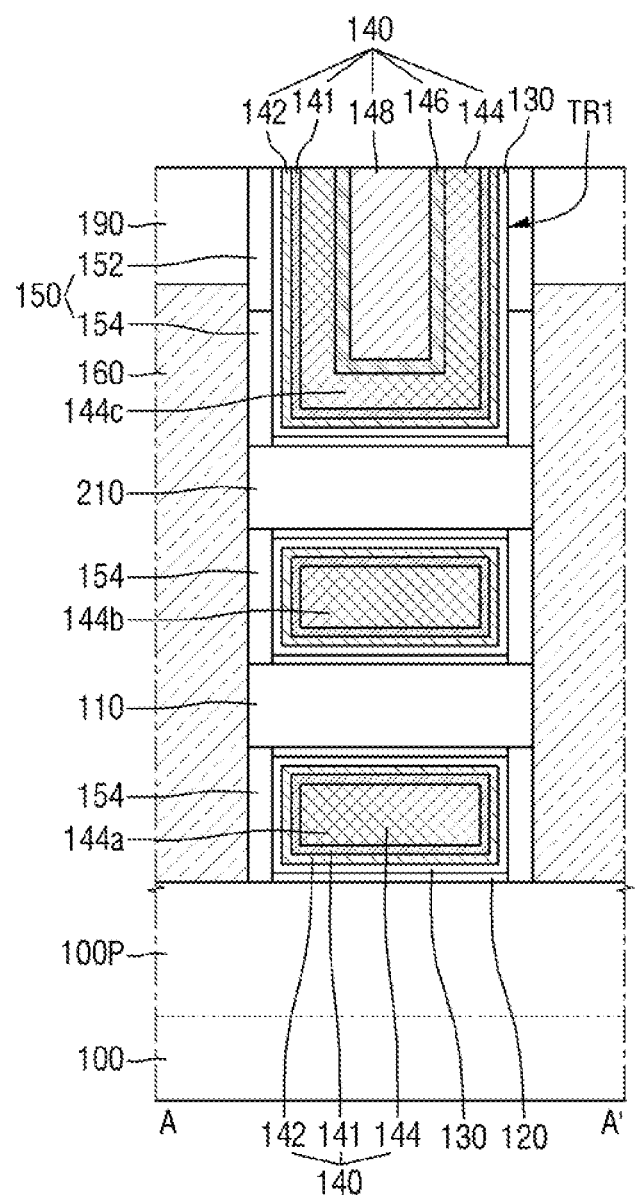
FIGS. 7 and 8 are diagrams for explaining the semiconductor device according to an exemplary embodiment of the present inventive concept.
Figure 8:
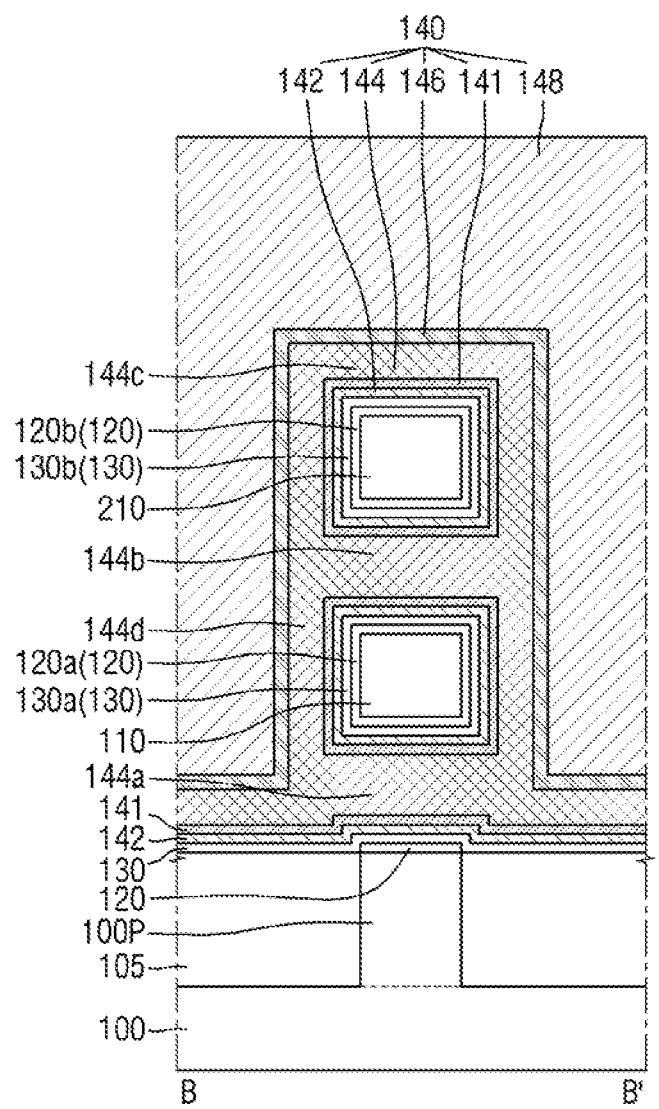

FIGS. 7 and 8 are diagrams for explaining the semiconductor device according to an exemplary embodiment of the present inventive concept. For the sake of convenience of explanation, repeated parts of those described referring to FIGS. 1 to 6 will be briefly explained or omitted.

For reference, FIG. 7 is a cross-sectional view taken along line A-A' of FIG. 1, and FIG. 8 is a cross-sectional view taken along line B-B' of FIG. 1.

Referring to FIGS. 7 and 8, in the semiconductor device according to an exemplary embodiment of the present inventive concept, the first gate electrode 140 further includes a first etching prevention film 141.

The first etching prevention film 141 may be interposed between the first lower conductive film 142 and the first work function adjustment film 144, and may be formed along the profile of the first lower conductive film 142. The first etching prevention film 141 may be formed along the peripheries of the first active pattern 110 and the second active pattern 210. Thus, the first etching prevention film 141 may surround the first lower conductive film 142.

The first etching prevention film 141 may also be formed on the upper surface of the field insulating film 105 and the first fin-type protrusion 100P, and may extend along the inner wall of the first gate spacer 150. That is, the first etching prevention film 141 may extend along the sidewalls and the bottom surface of the first trench TR1, the periphery of the first active pattern 110, and the periphery of the second active pattern 210.

The first etching prevention film 141 may include, for example, at least one of TiN, TaN, WN, and any combination thereof.

In the following description, the first etching prevention film 141 will be described as including TaN.

In the fabricating process of the semiconductor device according to an exemplary embodiment of the present inventive concept, the first etching prevention film 141 may be formed to remove an unnecessary work function adjustment film to be formed later. For example, the first etching prevention film 141 may serve to prevent the first gate insulating film 130 and the like from being etched, in the process of removing the unnecessary work function adjustment films.

Figure 9:
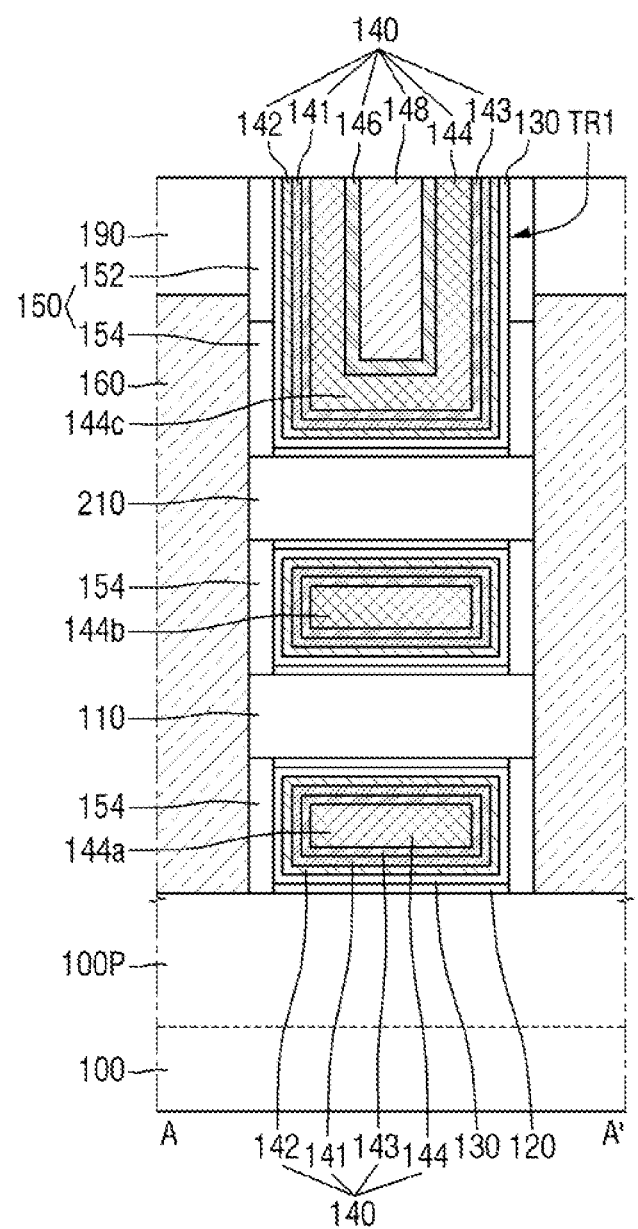
FIGS. 9 and 10 are diagrams for explaining the semiconductor device according to an exemplary embodiment of the present inventive concept.
Figure 10:
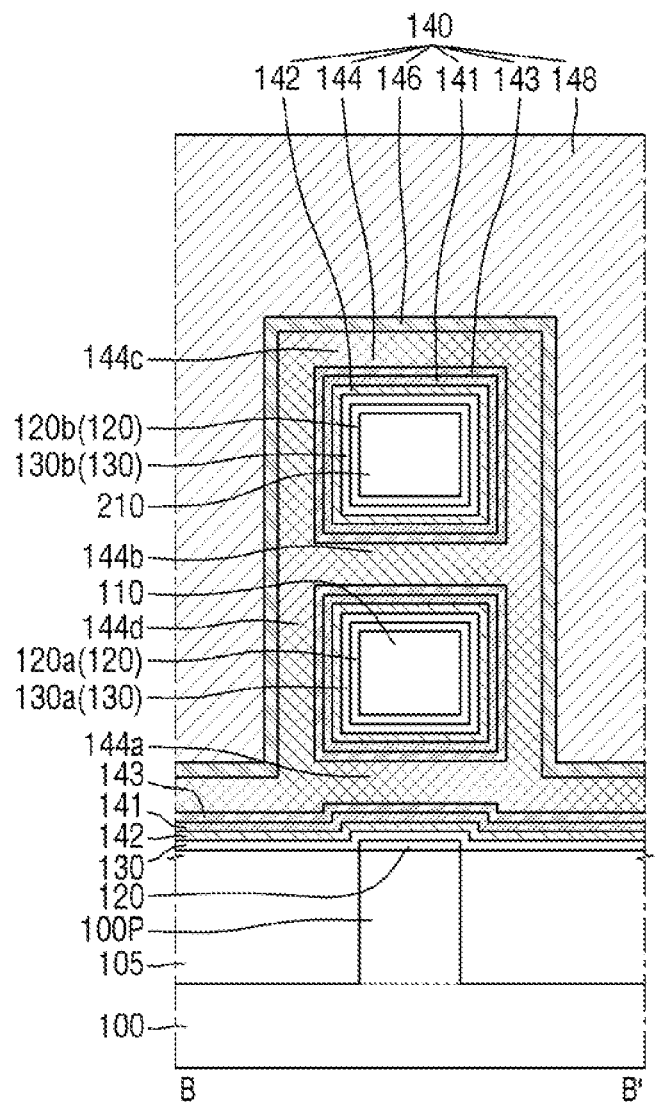

FIGS. 9 and 10 are diagrams for explaining the semiconductor device according to an exemplary embodiment of the present inventive concept. For the sake of convenience of explanation, repeated parts of those described referring to FIGS. 1 to 8 will be briefly explained or omitted.

For reference, FIG. 9 is a cross-sectional view taken along line A-A' of FIG. 1, and FIG. 10 is a cross-sectional view taken along line B-B' of FIG. 1.

Referring to FIGS. 9 and 10, in the semiconductor device according to an exemplary embodiment of the present inventive concept, the first gate electrode 140 further includes a second work function adjustment film 143.

The second work function adjustment film 143 may be interposed between the first gate insulating film 130 and the first work function adjustment film 144. For example, the second work function adjustment film 143 may be interposed between the first etching prevention film 141 and the first work function adjustment film 144. The second work function adjustment film 143 may be formed along the profile of the first etching prevention film 141, and may be formed along the peripheries of the first active pattern 110 and the second active pattern 210. Thus, the second work function adjustment film 143 may surround the first gate insulating film 130.

The second work function adjustment film 143 may also be formed on the upper surface of the field insulating film 105 and the first fin-type protrusion 100P, and may extend along the inner sidewalk of the first gate spacer 150. That is, the second work function adjustment film 143 may extend along the sidewalls and the bottom surface of the first trench TR1, the periphery of the first active pattern 110, and the periphery of the second active pattern 210.

In an exemplary embodiment of the present inventive concept, the second work function adjustment film 143 may be a p-type work function adjustment film. For example, the second work function adjustment film 143 may include TiN, but the present inventive concept is not limited thereto.

Figure 11:
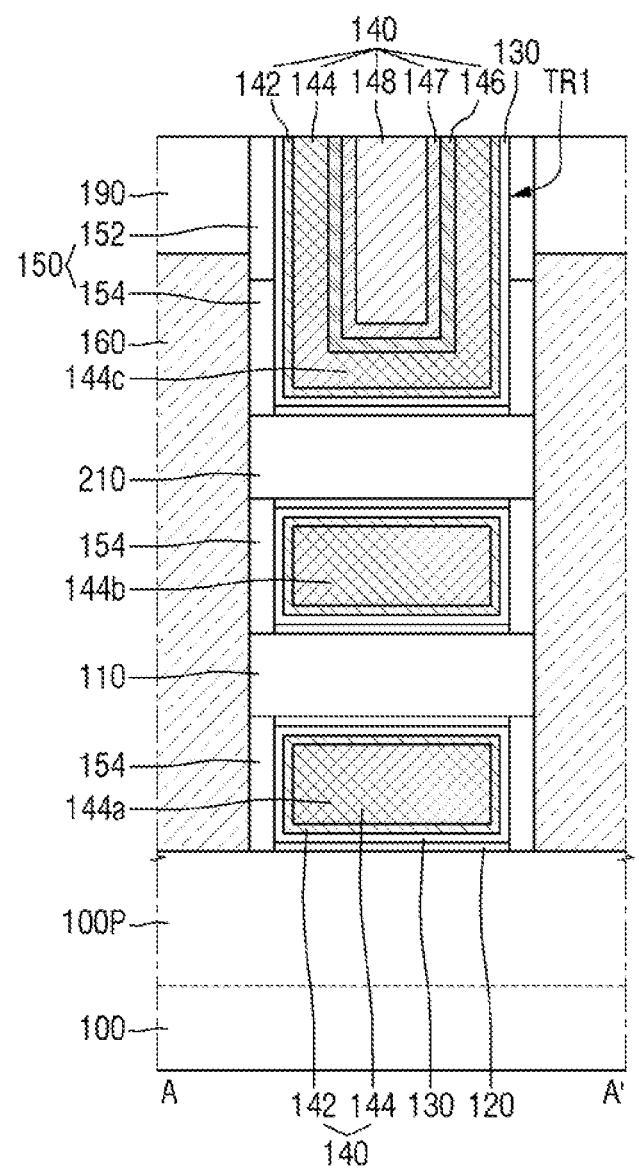
FIGS. 11 and 12 are diagrams for explaining the semiconductor device according to an exemplary embodiment of the present inventive concept.
Figure 12:
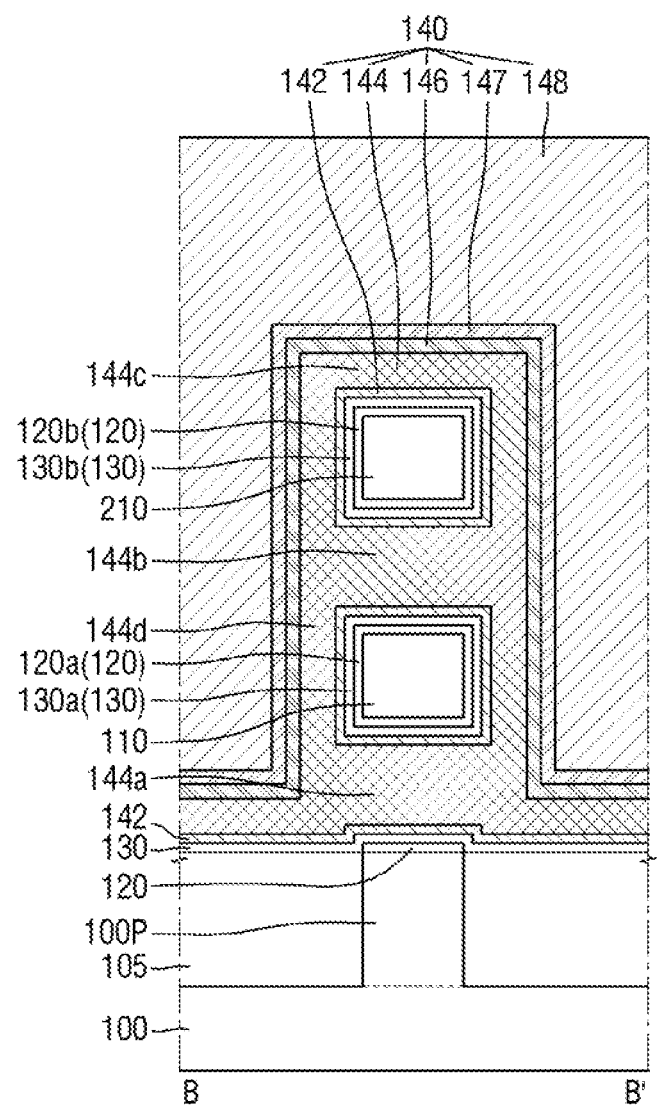

FIGS. 11 and 12 are diagrams for explaining the semiconductor device according to an exemplary embodiment of the present inventive concept. For the sake of convenience of explanation, repeated parts of those described referring to FIGS. 1 to 6 will be briefly explained or omitted.

For reference, FIG. 11 is a cross-sectional view taken along line A-A' of FIG. 1, and FIG. 12 is a cross-sectional view taken along line B-B' of FIG. 1.

Referring to FIGS. 11 and 12, in the semiconductor device according to an exemplary embodiment of the present inventive concept, the first gate electrode 140 further includes a second barrier film 147.

The second barrier film 147 may be disposed on the first barrier film 146, may be formed along the profile of the first barrier film 146, and may be in contact with the first barrier film 146.

The second barrier film 147 may also be formed on the upper surface of the field insulating film 105 and the first fin-type protrusion 100P, and may extend along the inner sidewalls of the first gate spacer 150. That is, the second barrier film 147 may extend along the sidewalls and the bottom surface of the first trench TR1.

The second barrier film 147 may include, for example, a substance the same as that of the first barrier film 146. Each of the first barrier film 146 and the second barrier film 147 may include, for example, TiN. However, a boundary surface may be formed between the first barrier film 146 and the second barrier film 147.

The formation of the boundary surface between the first barrier film 146 and the second barrier film 147 may be attributed to the film treatment process (FT of FIGS. 32 and 33) which is performed after the formation of the first barrier film 146. For example, a crystal structure of the upper surface of the first barrier film 146 may be different from a crystal structure of the second barrier film 147, due to the film treatment process FT performed on the first barrier film 146.

Each of the first barrier film 146 and the second barrier film 147 may have a thickness of about 10 Å or more. Alternatively, each of the first barrier film 146 and the second barrier film 147 may have a thickness in which, for example, TiN unit lattices of at least two or more layers are stacked.

In an exemplary embodiment of the present inventive concept, the thickness of the second barrier film 147 may be greater than or equal to the thickness of the first barrier film 146, but the present inventive concept is not limited thereto.

Figure 13:
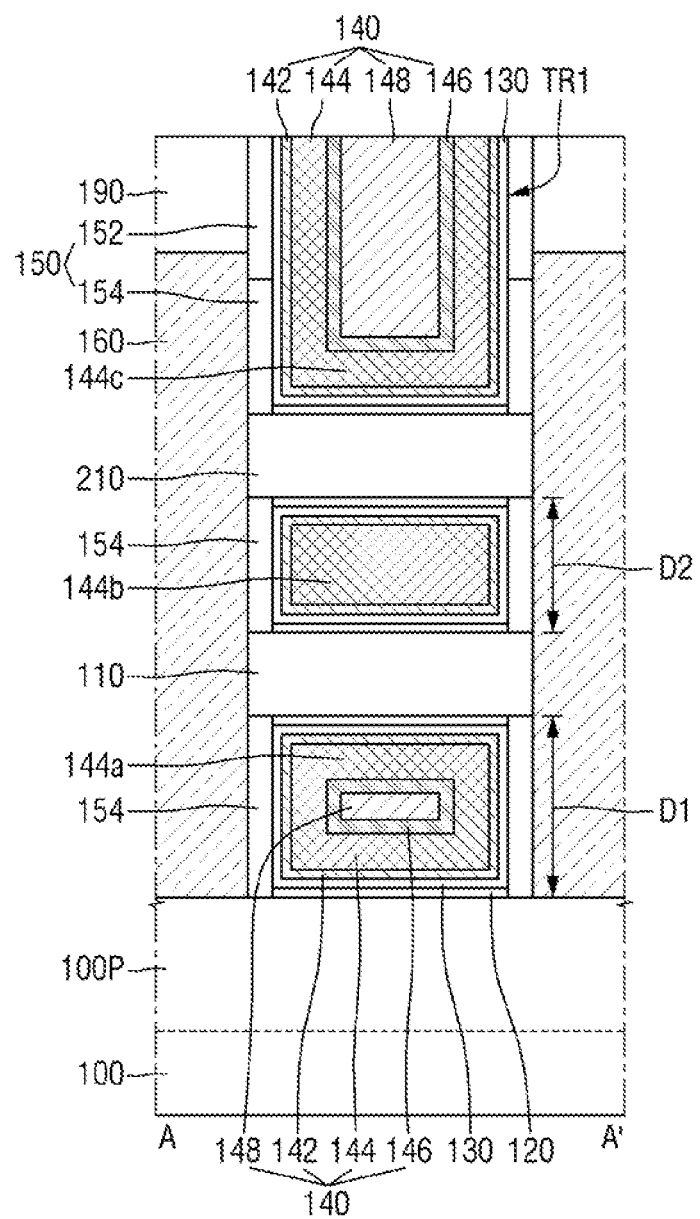
FIGS. 13 and 14 are diagrams for explaining the semiconductor device according to an exemplary embodiment of the present inventive concept.
Figure 14:
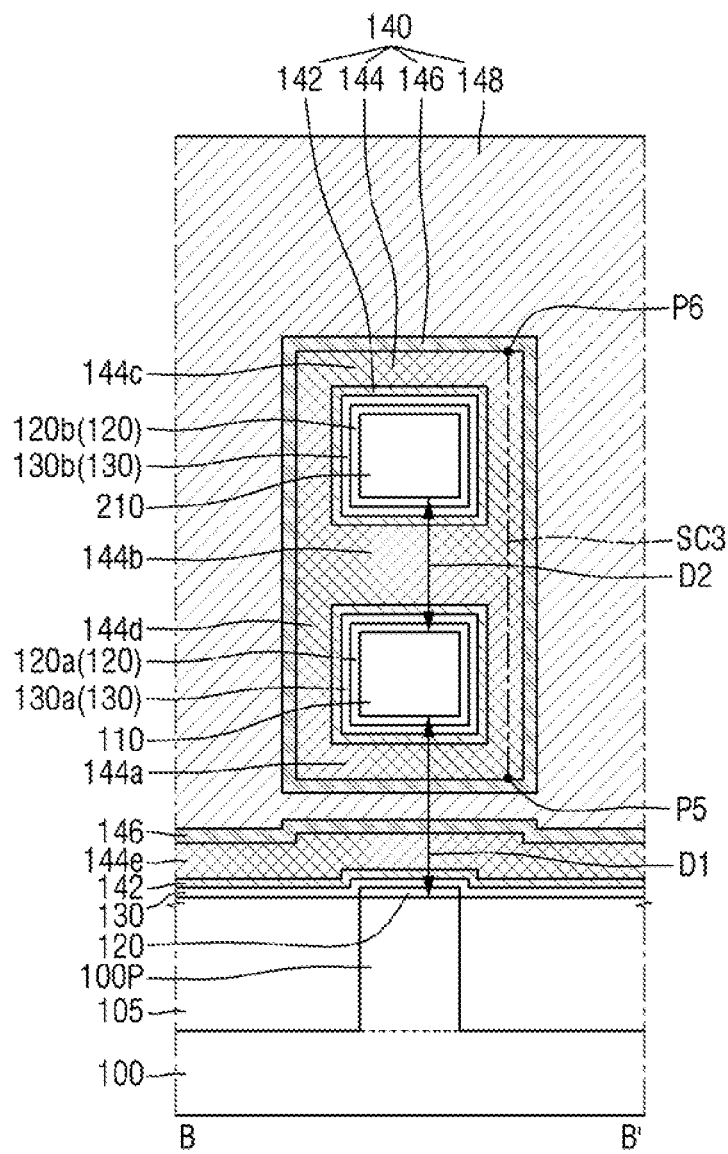

FIGS. 13 and 14 are diagrams for explaining the semiconductor device according to an exemplary embodiment of the present inventive concept. For the sake of convenience of explanation, repeated parts of those described referring to FIGS. 1 to 6 will be briefly explained or omitted.

For reference, FIG. 13 is a cross-sectional view taken along line A-A' of FIG. 1, and FIG. 14 is a cross-sectional view taken along line B-B' of FIG. 1.

Referring to FIGS. 13 and 14, in the semiconductor device according to an exemplary embodiment of the present inventive concept, the bottom surface of the first work function adjustment film 144 may be in contact with the first barrier film 146. For example, the bottom surface of the first central portion 144a of the first work function adjustment film 144 may be in contact with the first barrier film 146.

As illustrated in FIG. 14, the first work function adjustment film 144 may further include a lower portion 144e.

The lower portion 144e of the first work function adjustment film 144 may be a part of the first work function adjustment film 144 disposed on the upper surface of the field insulating film 105 and the first fin-type protrusion 100P. Also, the lower portion 144e may be disposed below and spaced apart from the first central portion 144a. For example, a first barrier film 146 and a first filling conductive film 148 may be interposed between the lower portion 144e and the first central portion 144a.

In an exemplary embodiment of the present inventive concept, a first distance D1 at which the first fin-type protrusion 100P and the first active pattern 110 are spaced apart from each other may be larger than a second distance D2 at which the first active pattern 110 and the second active pattern 210 are spaced apart from each other. Thus, in an exemplary embodiment of the present inventive concept, the first filling conductive film 148 may also be formed in a separated space between the first fin-type protrusion 100P and the first active pattern 110.

Figure 15:
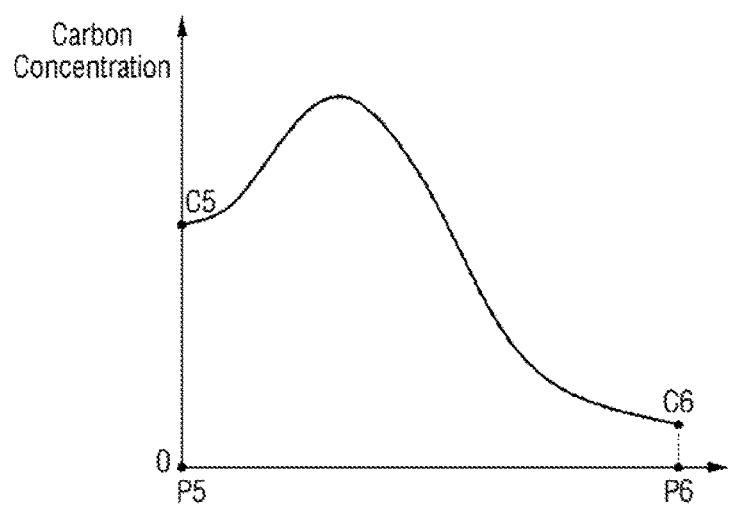
FIG. 15 is a graph for explaining the semiconductor device according to FIGS. 13 and 14.

FIG. 15 is a graph for explaining the semiconductor device according to FIGS. 13 and 14.

Referring to FIG. 15, in the semiconductor device according to an exemplary embodiment of the present inventive concept, the carbon concentration of the first work function adjustment film 144 may increase as it goes away from the first barrier film 146.

FIG. 15 is a graph illustrating a change in carbon concentration of the first work function adjustment film 144 when moving along the third scan line SC3 of FIG. 14. The third scan line SC3 is a straight line which connects the fifth point (P5 of FIG. 14) of the first work function adjustment film 144 and the sixth point (P6 of FIG. 14) of the first work function adjustment film 144. The third scan line SC3 may be perpendicular to the upper surface of the substrate 100.

The fifth point P5 of the first work function adjustment film 144 is one point on the bottom surface of the first work function adjustment film 144. For example, the fifth point P5 may be one point on the bottom surface of the side portion 144d of the first work function adjustment film 144. A sixth point P6 of the first work function adjustment film 144 is a point at which the straight line starting at the fifth point P5 and perpendicular to the upper surface of the substrate 100 meets the upper surface of the first work function adjustment film 144. Since the third scan line SC3 is a straight line which connects the fifth point P5 and the sixth point P6, the third scan line SC3 may be perpendicular to the upper surface of the substrate 100.

Referring to FIG. 15, when moving from the fifth point P5 to the sixth point P6 along the third scan line SC3, the carbon concentration of the first work function adjustment film 144 may increase and then decrease. For example, the carbon concentration of the first work function adjustment film 144 may increase from the fifth concentration C5 of the fifth point P5 and then decrease to reach the sixth concentration C6 of the sixth point P6. That is, the carbon concentration of the first work function adjustment film 144 may start with one relatively high concentration (e.g. the fifth concentration C5) at the bottom surface of the first work function adjustment film 144 (e.g., the bottom surface of the side portion 144d at the fifth point P5) and may gradually increase along a line (e.g., the third scan line SC3) perpendicular to the upper surface of the substrate 100 to reach a highest concentration at one point (e.g., at a point lower than the middle of the third scan line SC3), then may gradually decrease to reach a relatively low concentration (e.g. the sixth concentration C6) at the upper surface of the first work function adjustment film 144 (e.g., the upper surface of the side portion 144d at the sixth point P6).

Based on FIGS. 14 and 15, the carbon concentration of the first work function adjustment film 144 may increase as it goes away from the first barrier film 146 being in contact with the first work function adjustment film 144.

In an exemplary embodiment of the present inventive concept, the fifth concentration C5 may be greater than the sixth concentration C6. This may be attributed to, for example, the directionality of the film treatment process (FT of FIGS. 32 and 33). For example, depending on the directionality of the film treatment process FT, the upper surface of the first work function adjustment film 144 and the bottom surface of the first work function adjustment film 144 may be differently affected. For example, when the film treatment process FT is performed in a direction from above to below, the upper surface of the first work function adjustment film 144 may be affected to be greater than the bottom surface of the first work function adjustment film 144.

As illustrated in FIG. 14, the upper surface and the bottom surface of the first work function adjustment film 144 may be in contact with the first barrier film 146. For example, the bottom surface of the side portion 144d, the bottom surface of the first central portion 144a, the upper surface of the side portion 144d, and the upper surface of the third central portion 144c may be in contact with the first barrier film 146. As a result, the carbon concentration of the first work function adjustment film 144 may increase and then decrease, as it goes away from upper surface of the substrate 100.

In an exemplary embodiment of the present inventive concept, the carbon concentration of the side portion 144d of the first work function adjustment film 144 may increase and then decreased, as it goes away from the upper surface of the substrate 100.

The semiconductor device according to an exemplary embodiment of the present inventive concept may reduce the carbon concentration not only at the upper portion but also at the lower portion of the first work function adjustment film 144. For example, in the semiconductor device according to an exemplary embodiment of the present inventive concept, the carbon concentration of the first central portion 144a as well as the third central portion 144c may also be reduced. Therefore, the gate resistance may be further reduced, and as a result, the operation performance of the semiconductor device and the reliability of the product may be enhanced.

Figure 16:
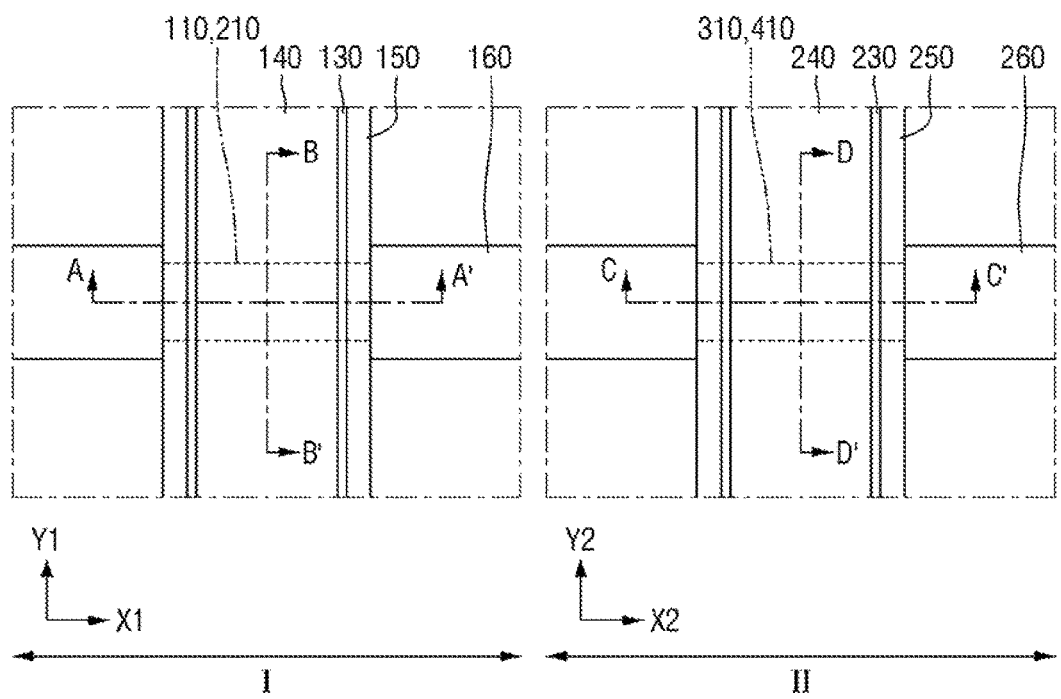
FIG. 16 is a schematic plan view for explaining the semiconductor device according to an exemplary embodiment of the present inventive concept.
Figure 17:
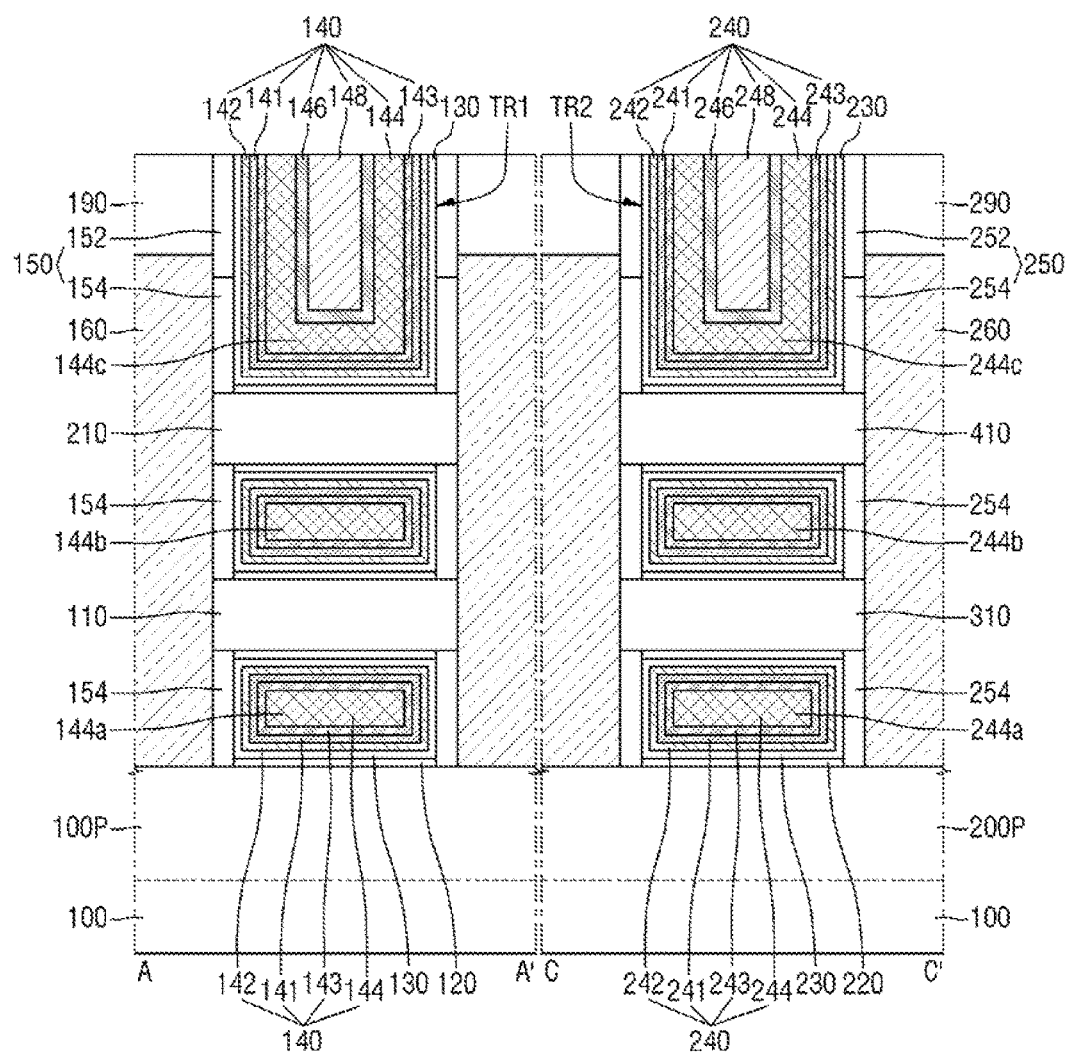
FIG. 17 is a cross-sectional view taken along lines A-A' and C-C' of FIG. 16.
Figure 18:
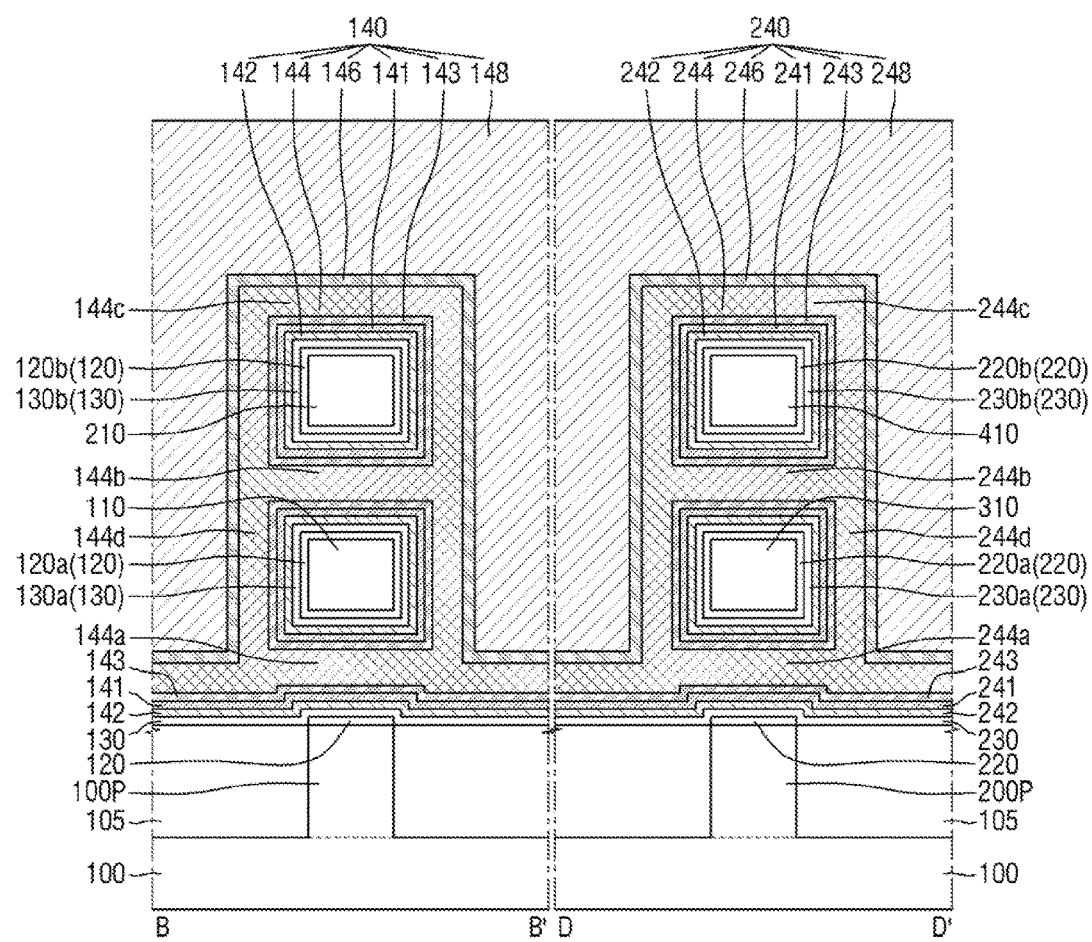
FIG. 18 is a cross-sectional view taken along line B-B' and line D-D' of FIG. 16.

FIG. 16 is a schematic plan view for explaining the semiconductor device according to an exemplary embodiment of the present inventive concept. FIG. 17 is a cross-sectional view taken along lines A-A' and C-C' of FIG. 16. FIG. 18 is a cross-sectional view taken along line B-B' and line D-D' of FIG. 16. For reference, since the explanation of the first region I of FIGS. 16 to 18 is substantially the same as that described with reference to FIGS. 9 and 10, explanation of FIGS. 16 to 18 will be mainly on the contents illustrated in the second region II.

Referring to FIGS. 16 to 18, the semiconductor device according to an exemplary embodiment of the present inventive concept includes a substrate 100 including the first region I and the second region II, a first gate electrode 140 formed in the first region I, and a second gate electrode 240 formed in the second region II.

The substrate 100 may include the first region I and the second region II. The first region I and the second region II may be regions spaced apart from each other, and may be regions connected to each other.

In the semiconductor device according to an exemplary embodiment of the present inventive concept, transistors of different conductivity types may be formed in the first region I and the second region II. For example, the first region I may be a region in which an NMOS transistor is formed, and the second region II may be a region in which a PMOS transistor is formed.

In the second region II of the substrate 100, a third active pattern 310, a fourth active pattern 410, a second interfacial film 220, a second gate insulating film 230, a second gate electrode 240, a second gate spacer 250, a second source/drain region 260, and an interlayer insulating film 290 which may be the same as the interlayer insulating film 190 in the first region I, may be formed.

Since the third active pattern 310, the fourth active pattern 410, the second interfacial film 220, the second gate insulating film 230, the second gate spacer 250, and the second source/drain region 260 may be substantially the same as the first active pattern 110, the second active pattern 210, the first interfacial film 120, the first gate insulating film 130, the first gate spacer 150, and the first source/drain region 160 of FIGS. 1 through 4, respectively, the detailed explanation thereof will not be provided below.

The substrate 100 may include a second fin-type protrusion 200P. The second fin-type protrusion 200P may protrude from the upper surface of the substrate 100 to extend along the third direction X2.

The second gate electrode 240 may extend along a fourth direction Y2 intersecting the third direction X2 on the substrate 100.

The second gate electrode 240 may be formed to wrap the peripheries of the third active pattern 310 and the fourth active pattern 410. Specifically, the second gate electrode 240 may be formed on the second gate insulating film 230, and may fill the second trench TR2.

The second gate electrode 240 may include a second lower conductive film 242, a second etching prevention film 241, a third work function adjustment film 243, a fourth work function adjustment film 244, a third barrier film 246, and a second filling conductive film 248.

The second lower conductive film 242 may be formed on the second gate insulating film 230, and may be formed along the profile of the second gate insulating film 230. The second lower conductive film 242 may extend along the sidewalls and the bottom surface of the second trench TR2, the periphery of the third active pattern 310, and the periphery of the fourth active pattern 410.

The second lower conductive film 242 may include, for example, a metal nitride, and may include, for example, at least one of TiN, TaN, WN, and any combination thereof. In the following description, the second lower conductive film 242 will be described as including TiN.

The second etching prevention film 241 may be formed on the second lower conductive film 242, and may be formed along the profile of the second lower conductive film 242. The second etching prevention film 241 may extend along the sidewalls and the bottom surface of the second trench TR2, the periphery of the third active pattern 310, and the periphery of the fourth active pattern 410.

The second etching prevention film 241 may include, for example, at least one of TiN, TaN, WN, and any combination thereof. In the following description, the second etching prevention film 241 will be described as including TaN.

The third work function adjustment film 243 may be formed on the second etching prevention film 241, and may be formed along the profile of the second etching prevention film 241. The third work function adjustment film 243 may extend along the sidewalls and the bottom surface of the second trench TR2, the periphery of the third active pattern 310, and the periphery of the fourth active pattern 410.

In an exemplary embodiment of the present inventive concept, the third work function adjustment film 243 may be a p-type work function adjustment film. For example, the third work function adjustment film 243 may include TN, but the present inventive concept is not limited thereto.

In an exemplary embodiment of the present inventive concept, the third work function adjustment film 243 may include a substance the same as that of the second work function adjustment film 143. For example, both of the second work function adjustment film 143 and the third work function adjustment film 243 may include TiN.

The fourth work function adjustment film 244 may be formed on the third work function adjustment film 243, and may be formed along the profile of the third work function adjustment film 243. The fourth work function adjustment film 244 may extend along the sidewalls and the bottom surface of the second trench TR2, the periphery of the third active pattern 310, and the periphery of the fourth active pattern 410.

The fourth work function adjustment film 244 may include carbon (C). The fourth work function adjustment film 244 including carbon may further include, for example, at least one of Ti, Ta, W, Ru, Nb, Mo, Hf, La, and any combination thereof.

In an exemplary embodiment of the present inventive concept, the fourth work function adjustment film 244 may not have a carbon concentration gradient.

In an exemplary embodiment of the present inventive concept, the fourth work function adjustment film 244 may be an n-type work function adjustment film. For example, the fourth work function adjustment film 244 may include TiAlC or TiAlCN. Further, for example, the fourth work function adjustment film 244 may include a substance obtained by replacing Ti with any one of Ta, W, Ru, Nb, Mo, Hf and La among the above-described substances.

In an exemplary embodiment of the present inventive concept, the fourth work function adjustment film 244 may include a substance the same as that of the first work function adjustment film 144. For example, both of the first work function adjustment film 144 and the fourth work function adjustment film 244 may include TiAlC.

The third barrier film 246 may be formed on the fourth work function adjustment film 244, and may be formed along the profile of the fourth work function adjustment film 244. The third barrier film 246 may extend along sidewalls and a bottom surface of the second trench TR2.

The third barrier film 246 may include, for example, TiN.

The second filling conductive film 248 may be formed on the third barrier film 246. Further, the second filling conductive film 248 may fill the remaining space of the second trench TR2 which is left after forming the second interfacial film 220, the second gate insulating film 230, the second lower conductive film 242, the third work function adjustment film 243, the fourth work function adjustment film 244, and the third barrier film 246.

The second filling conductive film 248 may include, for example, a substance the same as that of the first filling conductive film 148.

FIGS. 19 to 33 are intermediate step diagrams for explaining a method for fabricating a semiconductor device according to an exemplary embodiment of the present inventive concept.

Figure 19:
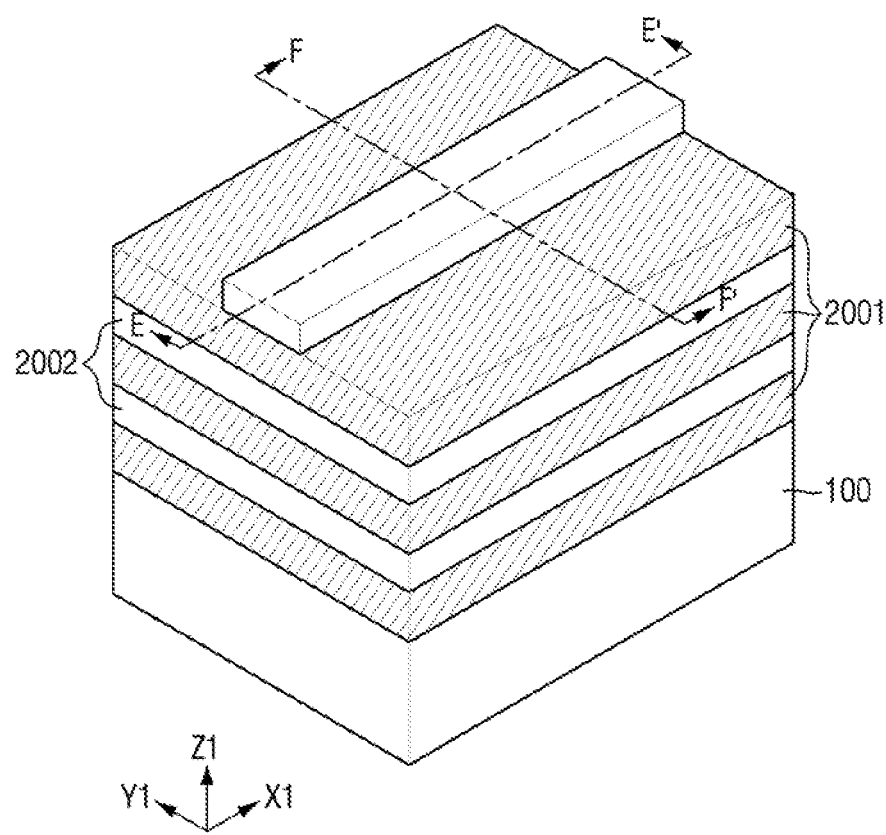
FIGS. 19 to 33 are intermediate step diagrams for explaining a method for fabricating a semiconductor device according to an exemplary embodiment of the present inventive concept.

For reference, FIGS. 20, 22, 24, 26, 28, 30 and 32 are cross-sectional views taken along line E-E' of FIG. 19. FIGS. 21, 23, 25, 27, 29, 31 and 33 are cross-sectional views taken along line F-F' of FIG. 19.

Figure 20:
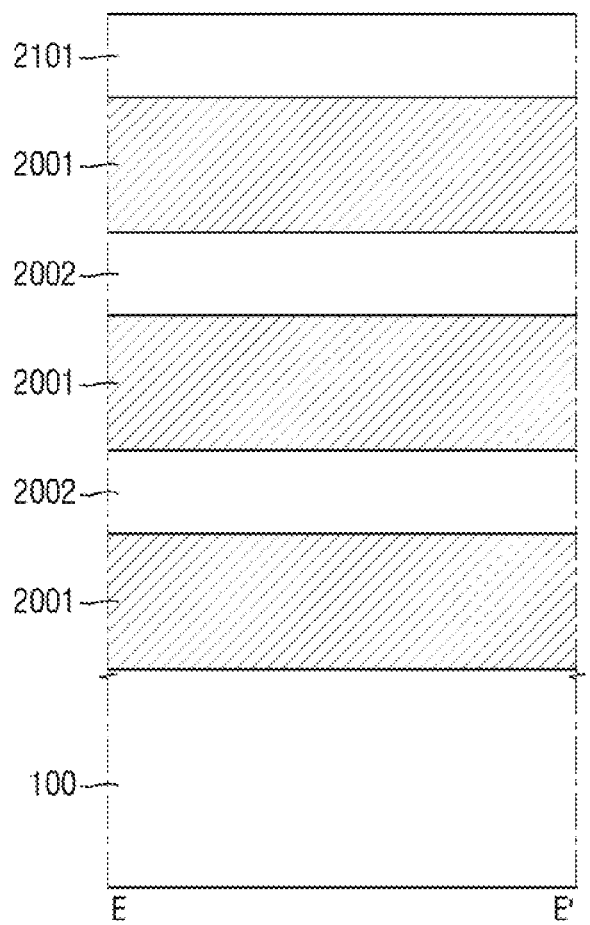
Figure 21:
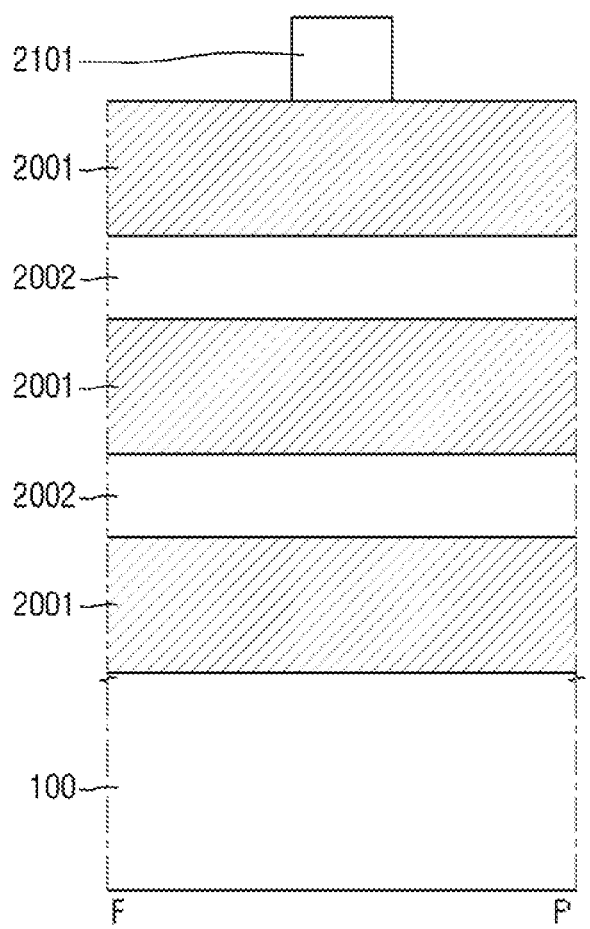

Referring to FIGS. 19 to 21, a substrate 100 in which sacrificial films 2001 and active films 2002 are alternately stacked may be provided.

The active film 2002 may include a substance having an etching selectivity to the sacrificial film 2001.

The sacrificial film 2001 and the active film 2002 may be formed by, for example, an epitaxial growth method.

In FIG. 19, although a configuration in which there are three sacrificial films 2001 and two active films 2002 is illustrated, but this is only for convenience of explanation, and the present inventive concept is not limited thereto. In the structure in which the sacrificial films 2001 and the active films 2002 are alternately stacked, the sacrificial film 2001 is illustrated as being located at the uppermost part, but the present inventive concept is not limited thereto.

Subsequently, a first mask pattern 2101 may be formed on the sacrificial film 2001.

The first mask pattern 2101 may extend along the first direction X1.

Figure 22:
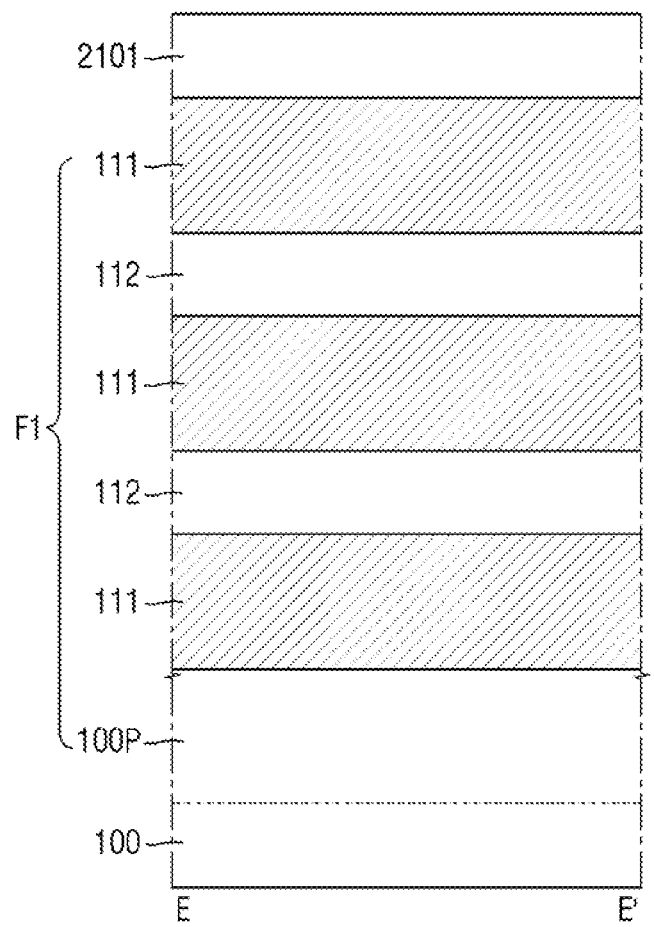
Figure 23:
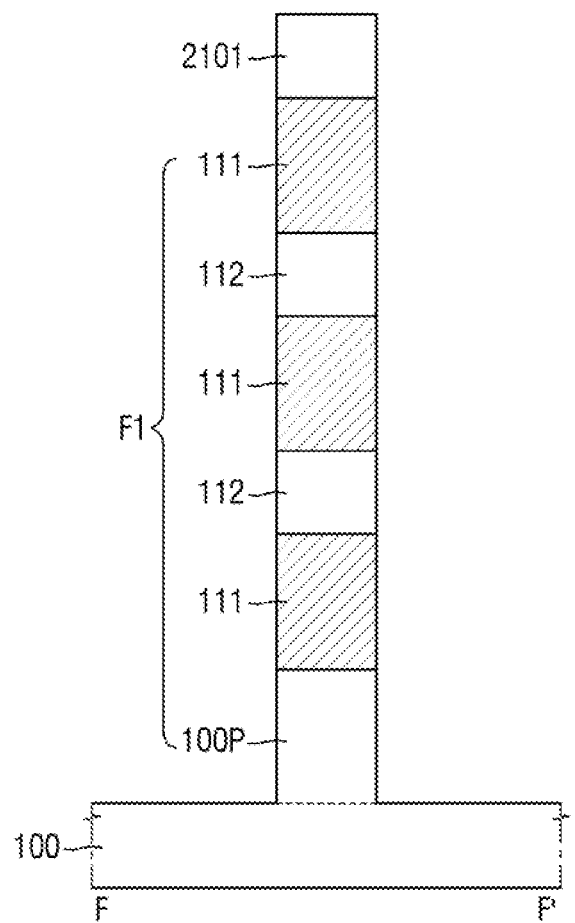

Referring to FIGS. 22 and 23, by using the first mask pattern 2101 as a mask, an etching process may be performed to form a fin-type structure F1.

The fin-type structure F1 may include a first fin-type protrusion 100P, and a sacrificial pattern 111 and an active pattern 112 alternately stacked on the first fin-type protrusion 100P.

Subsequently, a field insulating film 105 covering at least a part of the sidewall of the fin-type structure F1 may be formed on the substrate 100, and may cover the entire sidewall of the first fin-type protrusion 100P.

During the process of forming the field insulating film 105, the first mask pattern 2101 may be removed.

Figure 24:
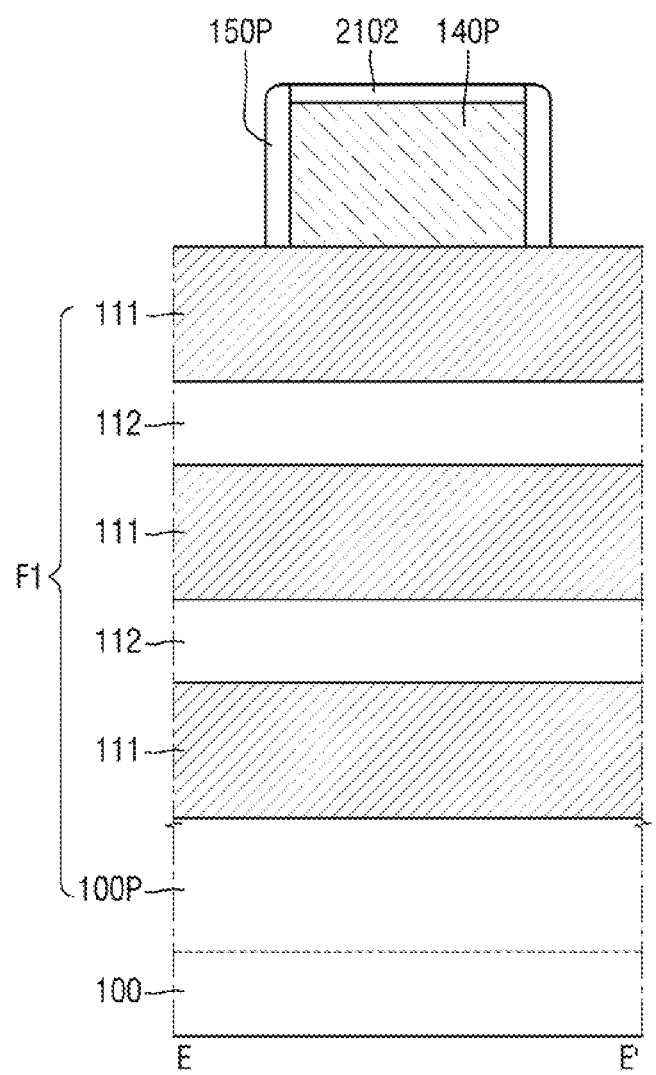
Figure 25:
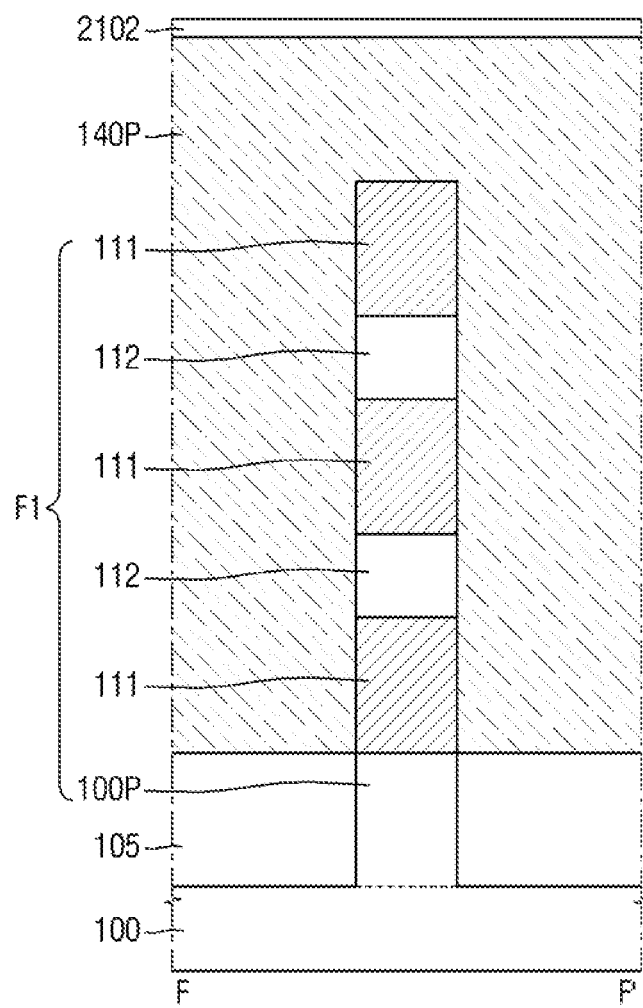

Referring to FIGS. 24 and 25, a dummy gate electrode 140P intersecting with the fin-type structure F1 and extending in the second direction Y1 may be formed.

The dummy gate electrode 140P may be formed, using the second mask pattern 2102 as a mask.

A dummy gate insulating film or a fin-type structure protection film may be further formed between the dummy gate electrode 140P and the fin-type structure F1.

A pre-gate spacer 150P may be formed on the sidewalls of the dummy gate electrode 140P.

Figure 26:
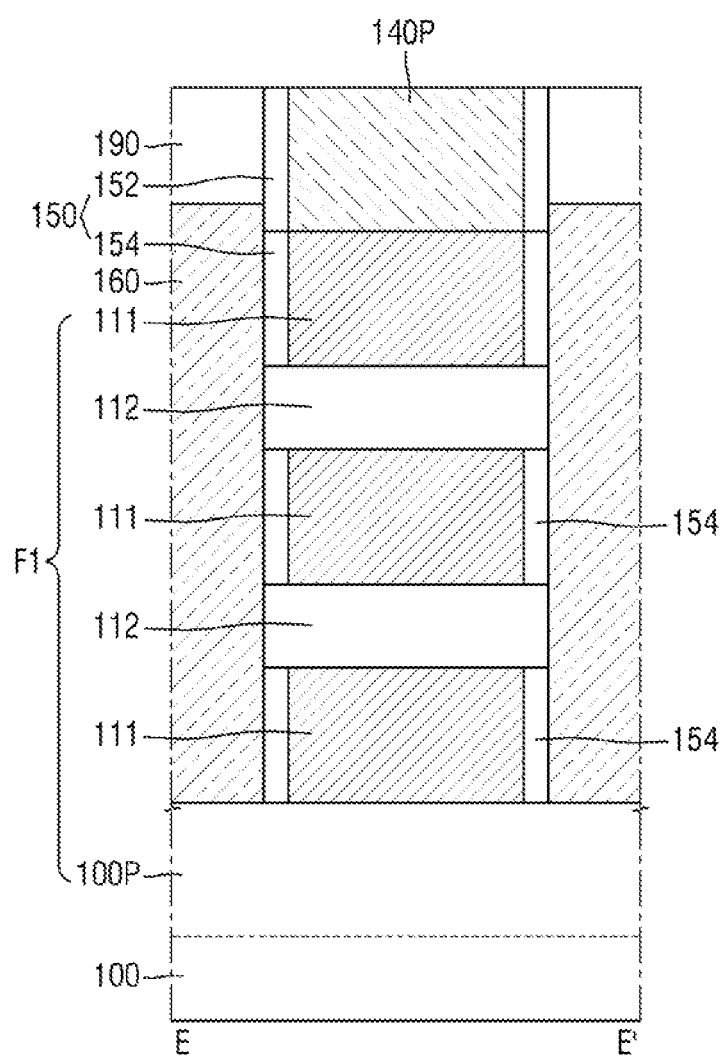
Figure 27:
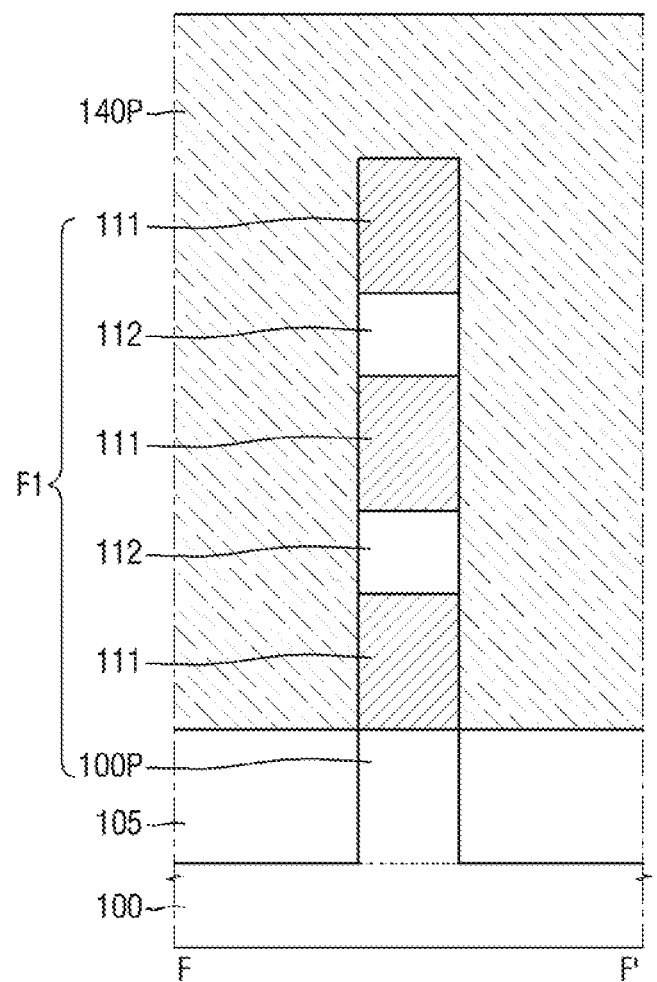

Referring to FIGS. 26 and 27, first source/drain regions 160 may be formed on both sides of the dummy gate electrode 140P.

In an exemplary embodiment of the present inventive concept, some of the sacrificial pattern 111 and the active pattern 112 may be removed to form the first source/drain region 160.

After some of the sacrificial pattern 111 and the active pattern 112 are removed, at least a part of the sacrificial pattern 111 overlapping the pre-gate spacer 150P may be further removed.

A first inner spacer 154 may be formed at the place of the additionally removed sacrificial pattern 111.

Subsequently, the first source/drain regions 160 may be formed on both sides of the dummy gate electrode 140P.

Subsequently, an interlayer insulating film 190 which covers the first source/drain region 160 may be formed on the substrate 100.

The dummy gate electrode 140P may be exposed by the interlayer insulating film 190.

While the interlayer insulating film 190 is formed, the second mask pattern 2102 may be removed. Also, while the interlayer insulating film 190 is formed, the first outer spacer 152 may be formed on the first inner spacer 154. Therefore, the first gate spacer 150 including the first inner spacer 154 and the first outer spacer 152 may be formed.

Figure 28:
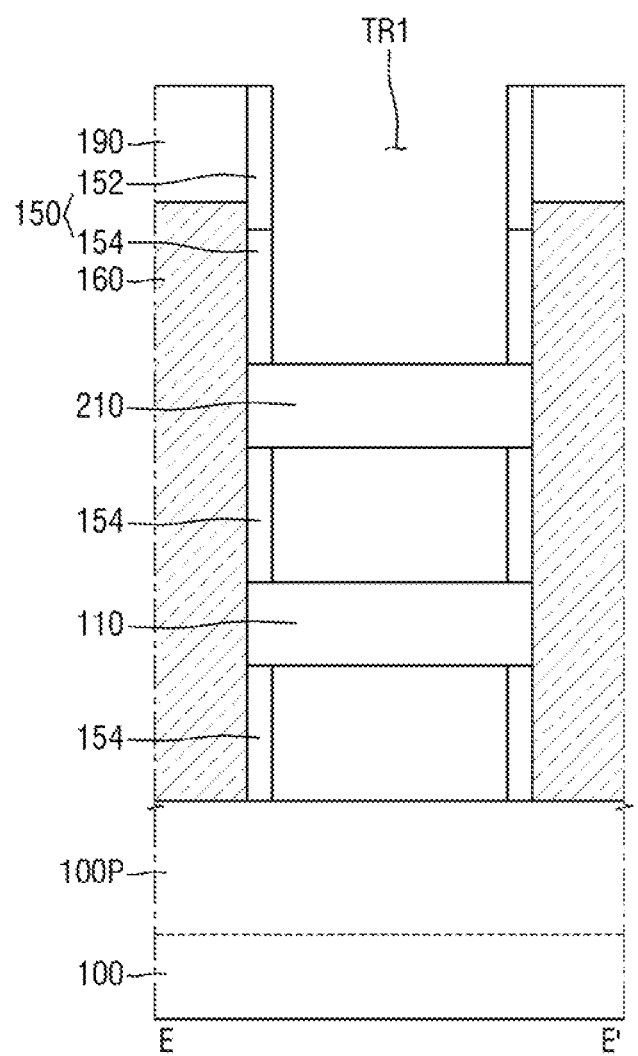
Figure 29:
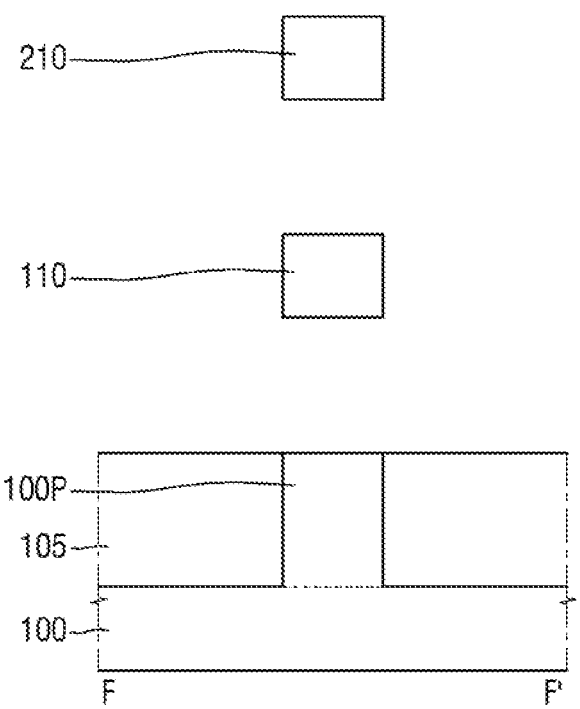

Referring to FIGS. 28 and 29, by removing the dummy gate electrode 140P and the sacrificial pattern 111, the first active pattern 110 and the second active pattern 210 may be formed on the substrate 100. Accordingly, the first active pattern 110 may be formed to be spaced apart from the first fin-type protrusion 100P, and the second active pattern 210 may be formed to be spaced apart from the first active pattern 110.

Figure 30:
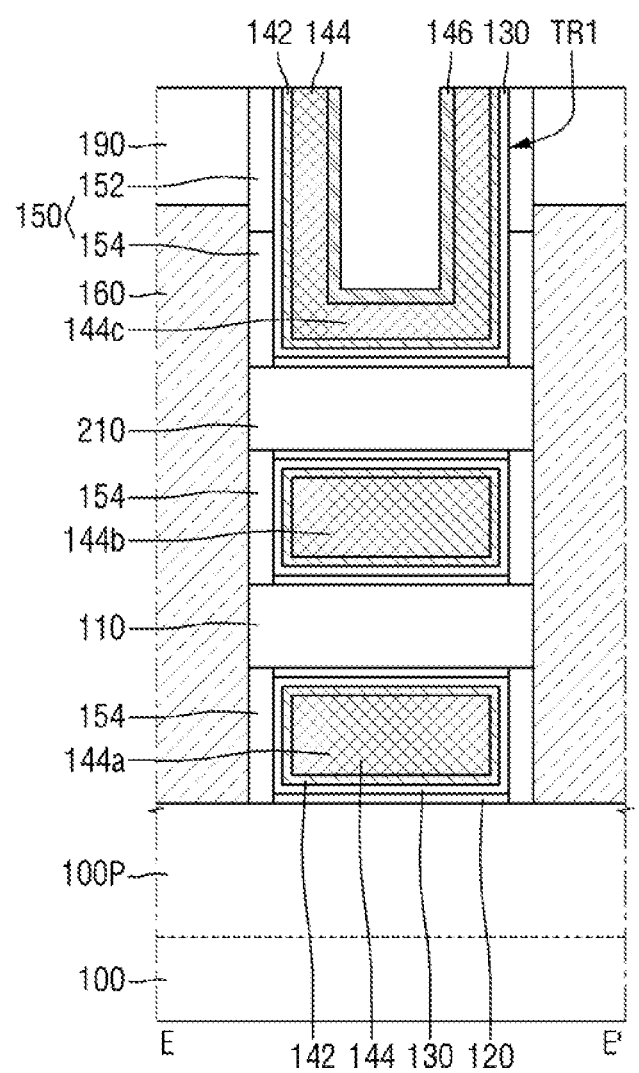
Figure 31:
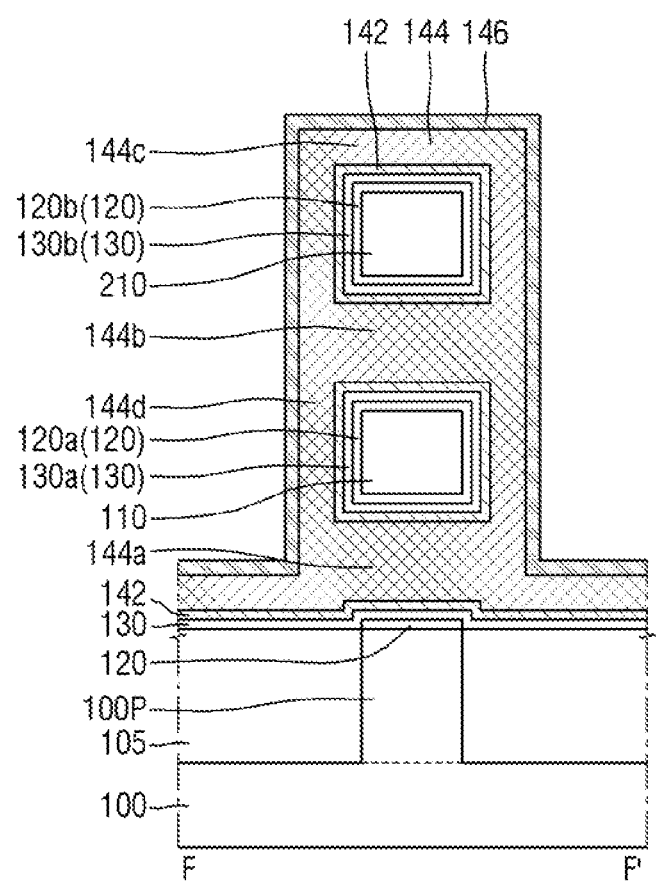

Referring to FIGS. 30 and 31, a first interfacial film 120 may be formed along the periphery of the first active pattern 110 and the periphery of the second active pattern 210.

The first interfacial film 120 may be formed by oxidation of the surfaces of the first active pattern 110 and the second active pattern 210, but the present inventive concept is not limited thereto.

Subsequently, a first gate insulating film 130, a first lower conductive film 142, a first work function adjustment film 144, and a first barrier film 146 may be sequentially formed along the periphery of the first active pattern 110, the periphery of the second active pattern 210, and the sidewalk and the bottom surface of the first trench TR1.

The first gate insulating film 130, the first lower conductive film 142, the first work function adjustment film 144, and the first barrier film 146 may be formed along the upper surface of the interlayer insulating film 190.

In an exemplary embodiment of the present inventive concept, the formation of the first work function adjustment film 144 and the formation of the first barrier film 146 may be performed in situ. That is, the formation of the first work function adjustment film 144 and the formation of the first barrier film 146 may be performed while the substrate assembly remains within a processing system, for example, the processing system may allow the substrate assembly to remain under vacuum conditions. In an exemplary embodiment of the present inventive concept, the in-situ process may be performed by depositing a TiAlC layer as the first work function adjustment film 144, and depositing a TiN layer as the first barrier film 146 over the TiAlC layer.

The first work function adjustment film 144 may include carbon, for example, a metal carbide film (e.g., TiAlC or TiAlCN), and may be formed by supplying a precursor gas containing carbon and a precursor gas or precursor gases containing one or more metal elements to the reaction chamber. The carbon content in the first work function adjustment film 144 may be controlled by arranging the sequence of the precursor gases supplied to the reaction chamber in conjunction with varying the quantities of the precursor gas containing carbon and the precursor gas(es) containing the metal element(s).

Referring to FIGS. 32 and 33, a film treatment process FT of the first work function adjustment film 144 may be performed. As a result, the carbon concentration gradient in the first work function adjustment film 144 may be adjusted.

The film treatment process FT may include at least one of, for example, a plasma treatment process, a heat treatment (annealing) process, a UV (ultraviolet ray) treatment process, and any combination thereof. For example, the film treatment process FT may include a hydrogen plasma treatment process.

The carbon concentration gradient of the first work function adjustment film 144 may be adjusted through the film treatment process FT. For example, the film treatment process FT may eliminate carbon in the first work function adjustment film 144. For example, carbon in the first work function adjustment film 144 forms hydrocarbon and ma be eliminated from the first work function adjustment film 144, by a hydrogen plasma treatment process.

The film treatment process FT may proceed from the surface of the semiconductor device according to FIGS. 32 and 33. That is, the film treatment process FT may exert greater influence on the surface of the first work function adjustment film 144 than the inside of the first work function adjustment film 144. As a result, more carbon content near the surface of the first work function adjustment film 144 may be removed, rendering a lower carbon concentration near the surface. For example, since the first barrier film 146 is formed on the first work function adjustment film 144, the carbon concentration of the first work function adjustment film 144 may increase as it goes away from the first barrier film 146.

In an exemplary embodiment of the present inventive concept, the thickness of the oxide film formed on the surface of the first work function adjustment film 144 may be minimized or removed while the film treatment process FT progresses. The oxide film may be a film formed by naturally oxidation of the surface of the first work function adjustment film 144. However, oxygen included in the surface of the first work function adjustment film 144 may be eliminated via the first barrier film 146, by the film treatment process FT.

In an exemplary embodiment of the present inventive concept, the crystal structure or the crystal arrangement of the surface of the first barrier film 146 may be changed while the film treatment process FT progresses. As a result, a boundary surface may be formed between the first barrier film 146 and the second barrier film (147 of FIGS. 11 and 12).

In an exemplary embodiment of the present inventive concept, after performing the film treatment process FT, a second barrier film 147 including a substance the same as that of the first barrier film 146 may be further formed on the first barrier film 146.

Next, referring to FIGS. 1 to 4, a first filling conductive film 148 may be formed on the first barrier film 146. Therefore, the first gate electrode 140 including the first lower conductive film 142, the first work function adjustment film 144, the first barrier film 146, and the first filling conductive film 148 may be formed.

While the present inventive concept has been particularly shown and described with reference to exemplary embodiments thereof, it will be understood by those of ordinary skill in the art that various changes in form and details may be made therein without departing from the spirit and scope of the present inventive concept as defined by the appended claims. It is therefore desired that the present exemplary embodiments be considered in all respects as illustrative and not restrictive.

What is claimed is:

1. A semiconductor device comprising:
a substrate;
a first active pattern disposed on the substrate and spaced apart from the substrate;
a gate insulating film which surrounds the first active pattern;
a first work function adjustment film which surrounds the gate insulating film and comprises carbon; and
a first barrier film which surrounds the first work function adjustment film,
wherein a carbon concentration of the first work function adjustment film increases as it goes away from the first barrier film.

2. The semiconductor device of claim 1, wherein the carbon concentration of the first work function adjustment film decreases as it goes away from an upper surface of the substrate.

3. The semiconductor device of claim 1, wherein the carbon concentration of the first work function adjustment film increases and then decreases, when moving from a first sidewall to a second sidewall opposite to the first sidewall of the first work function adjustment film along a plane parallel to an uppersurface of the substrate.

4. The semiconductor device of claim 1, further comprising a second active pattern disposed on the first active pattern and spaced apart from the first active pattern.

5. The semiconductor device of claim 4, wherein the first work function adjustment film comprises:
a first central portion which is disposed below the first active pattern and overlaps the first active pattern above;
a second central portion which is disposed between the first active pattern and the second active pattern, and overlaps the first active pattern and the second active pattern;
a third central portion which is disposed on the second active pattern, and overlaps the second active pattern; and
a side portion which extends on sidewalk of the first active pattern and sidewalls of the second active pattern to connect the first central portion, the second central portion, and the third central portion.

6. The semiconductor device of claim 1, wherein the first work function adjustment film is an n-type work function adjustment film.

7. The semiconductor device of claim 6, wherein the first work function adjustment film comprises at least one of Ti, Ta, W, Ru, Nb, Mo, Hf, La and any combination thereof.

8. The semiconductor device of claim 6, further comprising:
a second work function adjustment film interposed between the gate insulating film and the first work function adjustment film,
wherein the second work function adjustment film is a p-type work function adjustment film.

9. The semiconductor device of claim 1, wherein the first barrier film comprises TiN.

10. The semiconductor device of claim 1, further comprising:
a second harrier film on the first barrier film,
wherein the second barrier film is in contact with the first barrier film and comprises a substance the same as that of the first barrier film.

11. The semiconductor device of claim 1, further comprising a filling conductive film on the first barrier film.

12. The semiconductor device of claim 1, further comprising a lower conductive film interposed between the gate insulating film and the first work function adjustment film.

13. A semiconductor device comprising:
a substrate;
a first active pattern disposed on the substrate and spaced apart from the substrate;
a gate insulating film which surrounds the first active pattern; and
a work function adjustment film which surrounds the gate insulating film and comprises carbon,
wherein the work function adjustment film comprises:
a first central portion which is disposed below the first active pattern and overlaps the first active pattern; and
a second central portion which is dispose on the first active pattern and overlaps the first active pattern,
wherein a carbon concentration of the first central portion is different from a carbon concentration of the second central portion.

14. The semiconductor device of claim 13, wherein the carbon concentration of the second central portion is lower than the carbon concentration of the first central portion.

15. The semiconductor device of claim 13, further comprising:
a second active pattern disposed on the first active pattern and spaced apart from the first active pattern,
wherein the work function adjustment film further comprises a third central portion which is disposed over the second active pattern and overlaps the second active pattern.

16. The semiconductor device of claim 15, wherein a carbon concentration of the third central portion is lower than the carbon concentration of the first central portion and the carbon concentration of the second central portion.

17. The semiconductor device of claim 15, wherein the work function adjustment film further comprises a side portion which extends on sidewalls of the first active pattern and sidewalls of the second active pattern to connect the first central portion, the second central portion, and the third central portion.

18. The semiconductor device of claim 17, wherein a carbon concentration of the side portion of the work function adjustment film gradually decreases as it goes away from an upper surface of the substrate.

19. A semiconductor device comprising:
a gate insulating film on a substrate;
an n-type work function adjustment film comprising carbon on the gate insulating film; and
a first barrier film comprising on the n-type work function adjustment film,
wherein a carbon concentration of the n-type work function adjustment film increases as it goes away from the first barrier film.

20. The semiconductor device of claim 19, wherein the n-type work function adjustment film comprises TiAlC.

* * * * *